US007612416B2

(12) United States Patent
Takeuchi et al.

(10) Patent No.: US 7,612,416 B2
(45) Date of Patent: Nov. 3, 2009

(54) SEMICONDUCTOR DEVICE HAVING A CONDUCTIVE PORTION BELOW AN INTERLAYER INSULATING FILM AND METHOD FOR PRODUCING THE SAME

(75) Inventors: Kiyoshi Takeuchi, Tokyo (JP); Koichi Terashima, Tokyo (JP); Hitoshi Wakabayashi, Tokyo (JP); Shigeharu Yamagami, Tokyo (JP); Atsushi Ogura, Tokyo (JP); Masayasu Tanaka, Tokyo (JP); Masahiro Nomura, Tokyo (JP); Koichi Takeda, Tokyo (JP); Toru Tatsumi, Tokyo (JP); Koji Watanabe, Tokyo (JP)

(73) Assignee: NEC Corporation, Tokyo (JP)

( * ) Notice: Subject to any disclaimer, the term of this patent is extended or adjusted under 35 U.S.C. 154(b) by 72 days.

(21) Appl. No.: 10/575,631

(22) PCT Filed: Sep. 29, 2004

(86) PCT No.: PCT/JP2004/014243

§ 371 (c)(1),
(2), (4) Date: Jan. 30, 2007

(87) PCT Pub. No.: WO2005/036651

PCT Pub. Date: Apr. 21, 2005

(65) Prior Publication Data

US 2007/0132009 A1 Jun. 14, 2007

(30) Foreign Application Priority Data

Oct. 9, 2003 (JP) .............................. 2003-351029
Sep. 17, 2004 (JP) .............................. 2004-271506

(51) Int. Cl.
*H01L 27/01* (2006.01)
(52) U.S. Cl. ................ 257/377; 257/347; 257/E29.299
(58) Field of Classification Search .................. 257/377, 257/347, E29.299
See application file for complete search history.

(56) References Cited

U.S. PATENT DOCUMENTS 5,930,163 A 7/1999 Hara et al.

(Continued)

FOREIGN PATENT DOCUMENTS

JP 64-008670 1/1989

(Continued)

OTHER PUBLICATIONS

M. Ishida, et al., "A Novel 6T-SRAM Cell Technology Designed with Rectangular Patterns Scalable beyond 0.18 μm Generation and Desirable for Ultra High Speed Operation," International Electron Devices Meeting, Dec. 6-9, 1998, pp. 8.2.1-8.2.4.

*Primary Examiner*—Eugene Lee
(74) *Attorney, Agent, or Firm*—Dickstein Shapiro LLP

(57) ABSTRACT

A semiconductor device comprising: a MIS type field effect transistor which comprises a semiconductor raised portion protruding from a substrate plane, a gate electrode extending over the semiconductor raised portion from the top onto the opposite side faces of the semiconductor raised portion, a gate insulation film existing between the gate electrode and the semiconductor raised portion, and source and drain regions provided in the semiconductor raised portion; an interlayer insulating film provided on a substrate including the transistor; and a buried conductor interconnect that is formed by filling in a trench formed in the interlayer insulating film with a conductor, wherein the buried conductor interconnect connects one of the source and drain regions of the semiconductor raised portion and another conductive portion below the interlayer insulating film.

14 Claims, 24 Drawing Sheets

U.S. PATENT DOCUMENTS

| | | |
|---|---|---|
| 6,867,433 B2 * | 3/2005 | Yeo et al. .................... 257/67 |
| 6,900,513 B2 | 5/2005 | Natsume |
| 7,105,894 B2 * | 9/2006 | Yeo et al. .................... 257/347 |
| 2003/0067819 A1 | 4/2003 | Satomi et al. |
| 2003/0096501 A1 * | 5/2003 | Ootsuka et al. ............ 438/689 |
| 2005/0029556 A1 * | 2/2005 | Wang et al. ................. 257/250 |

FOREIGN PATENT DOCUMENTS

| | | |
|---|---|---|
| JP | 03-177072 | 8/1991 |
| JP | 06-005856 | 1/1994 |
| JP | 08-298328 | 11/1996 |
| JP | 10-093093 | 4/1998 |
| JP | 10-178110 | 6/1998 |
| JP | 2001-298194 | 10/2001 |
| JP | 2002-118255 | 4/2002 |
| JP | 2002-289703 | 10/2002 |
| JP | 2002-289871 | 10/2002 |
| JP | 2003-115551 | 4/2003 |
| JP | 2003-229575 | 8/2003 |
| WO | WO-2005/119763 | 12/2005 |
| WO | WO-2005/119764 | 12/2005 |

* cited by examiner (Fig. 1)
(a) Prior Art
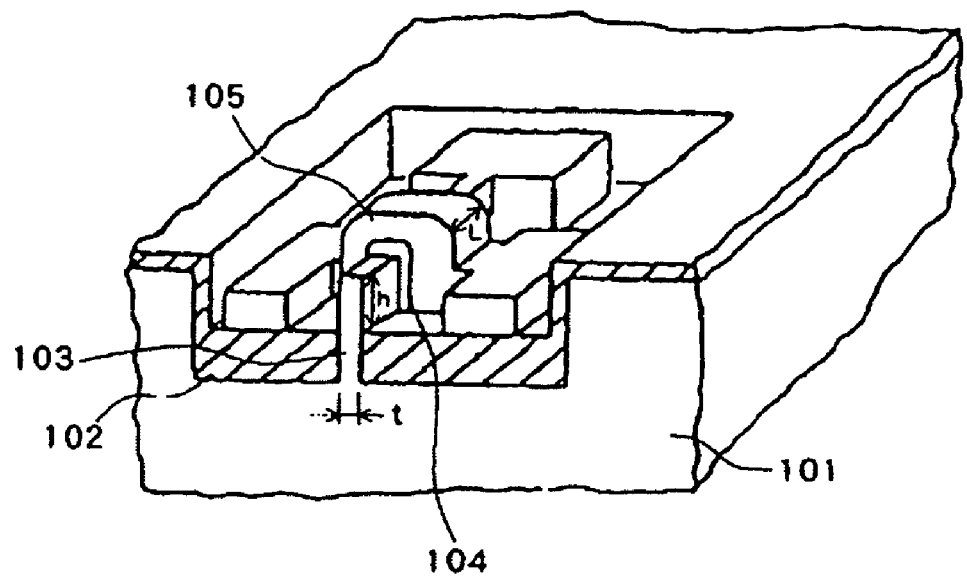
(b) Prior Art
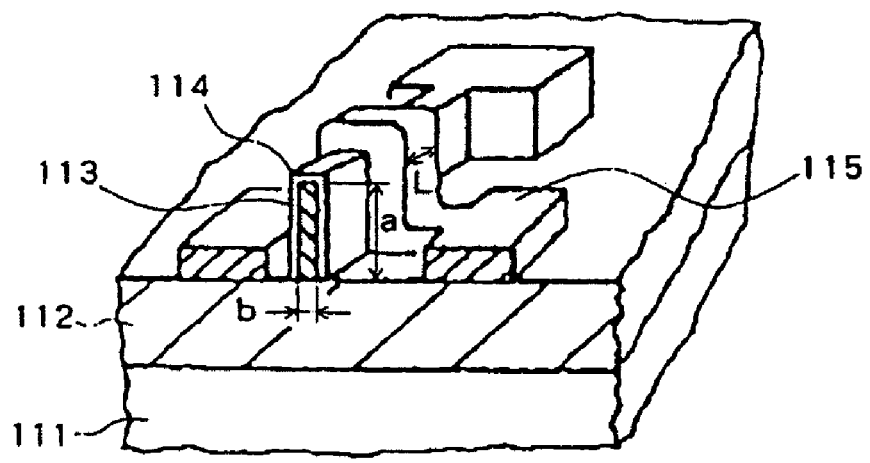

(Fig. 2)
(a) Prior Art
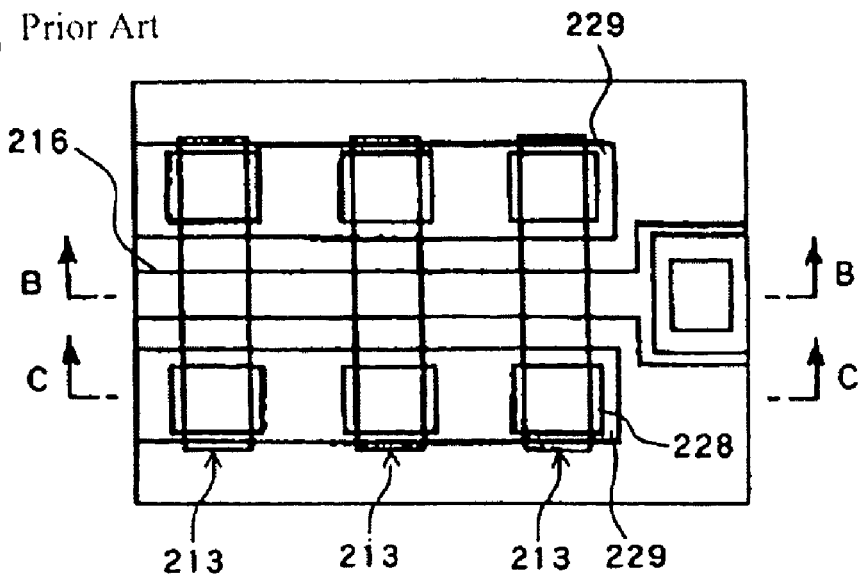
(b) Prior Art
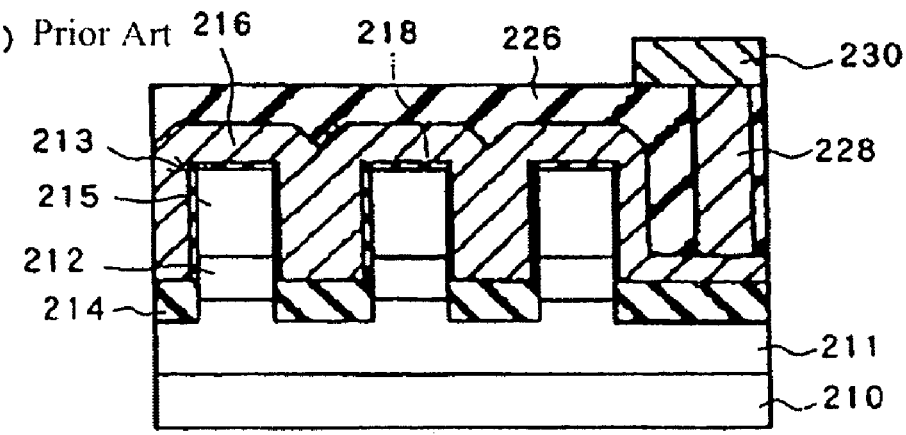
(c) Prior Art
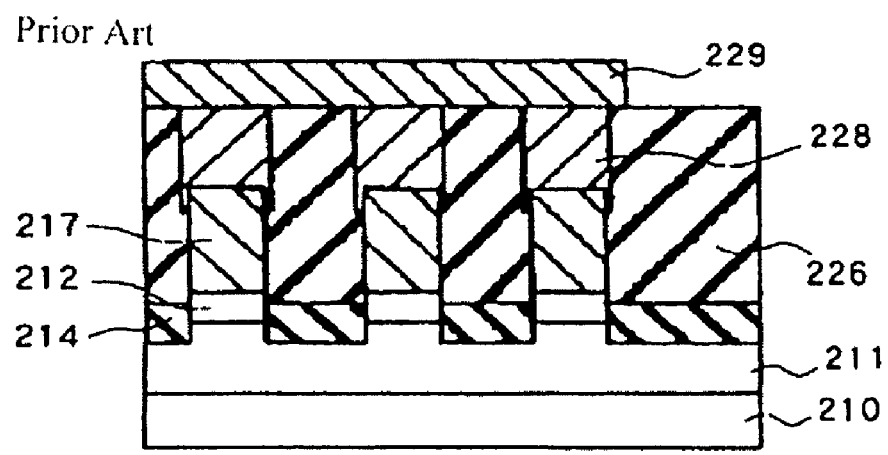

(Fig. 3)
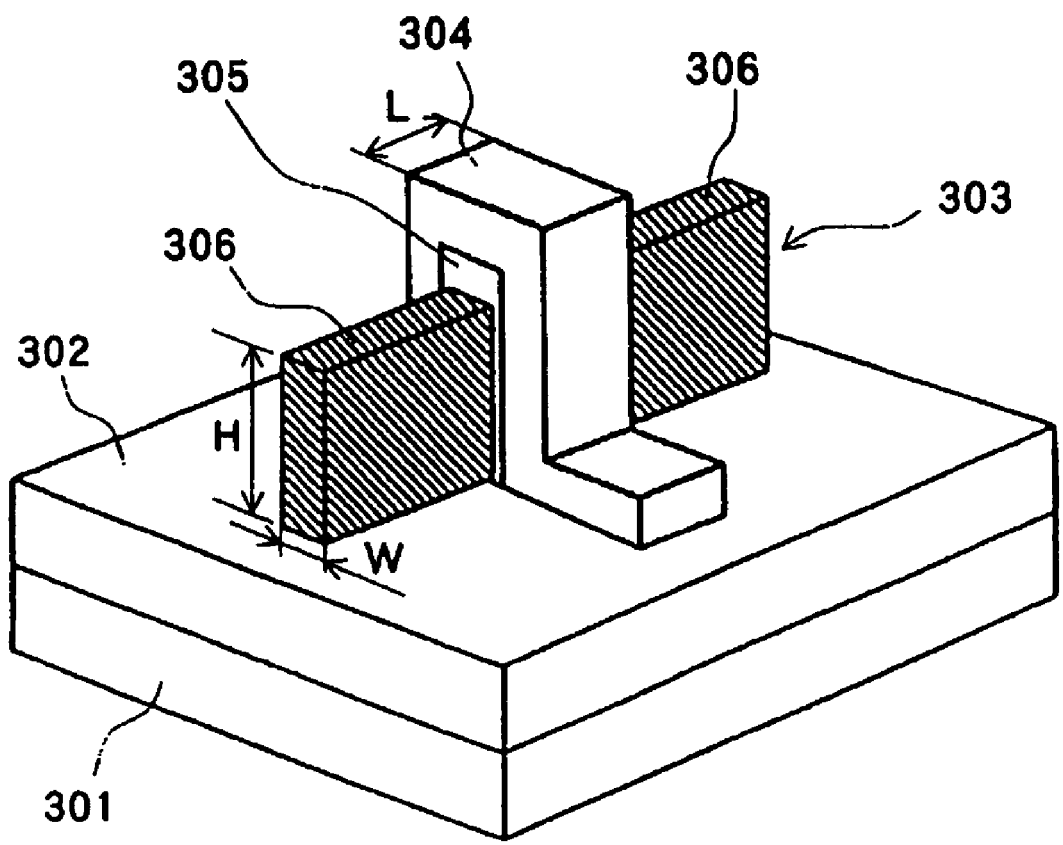

(Fig. 4)
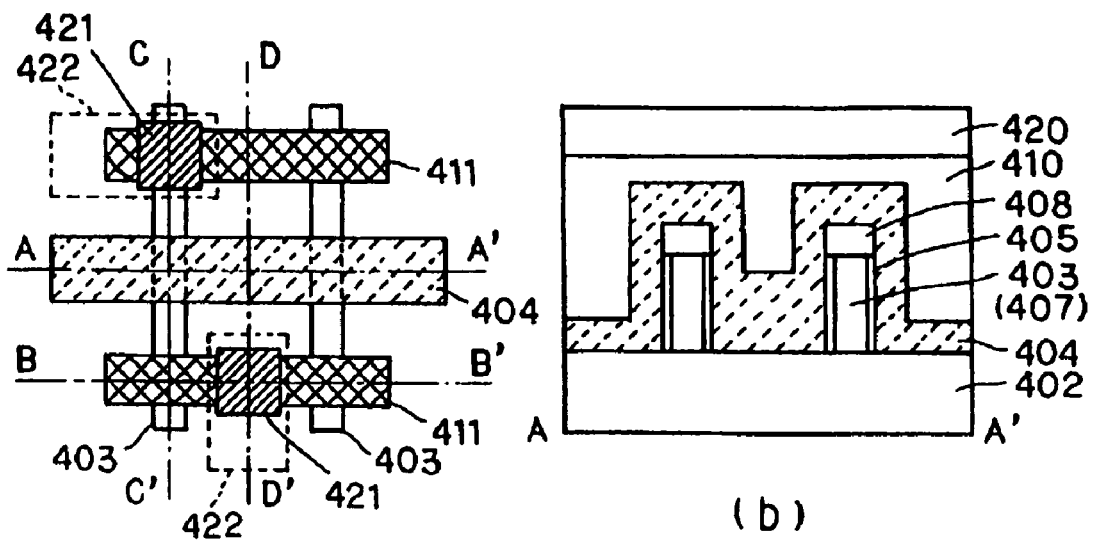
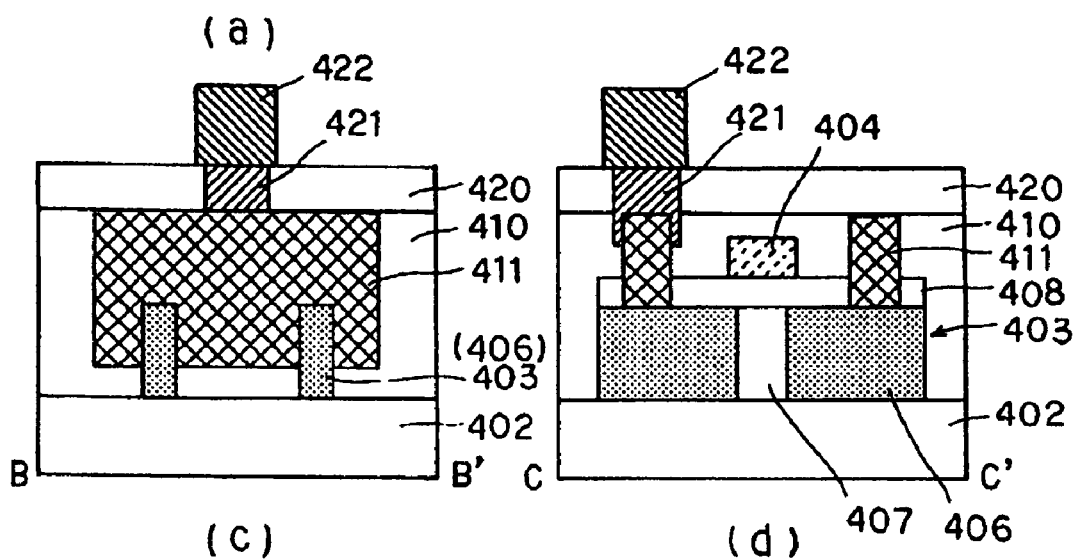
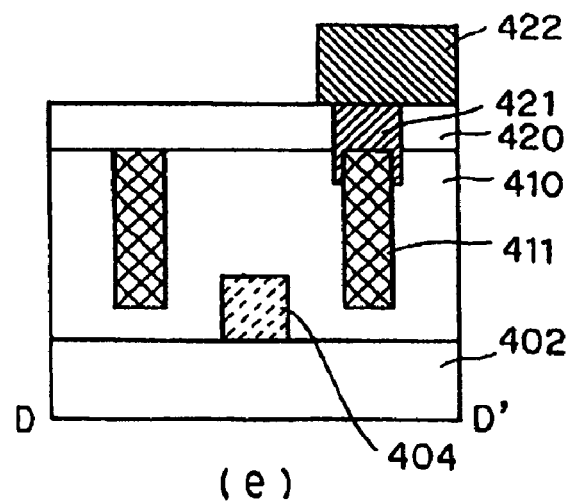

(Fig. 5)
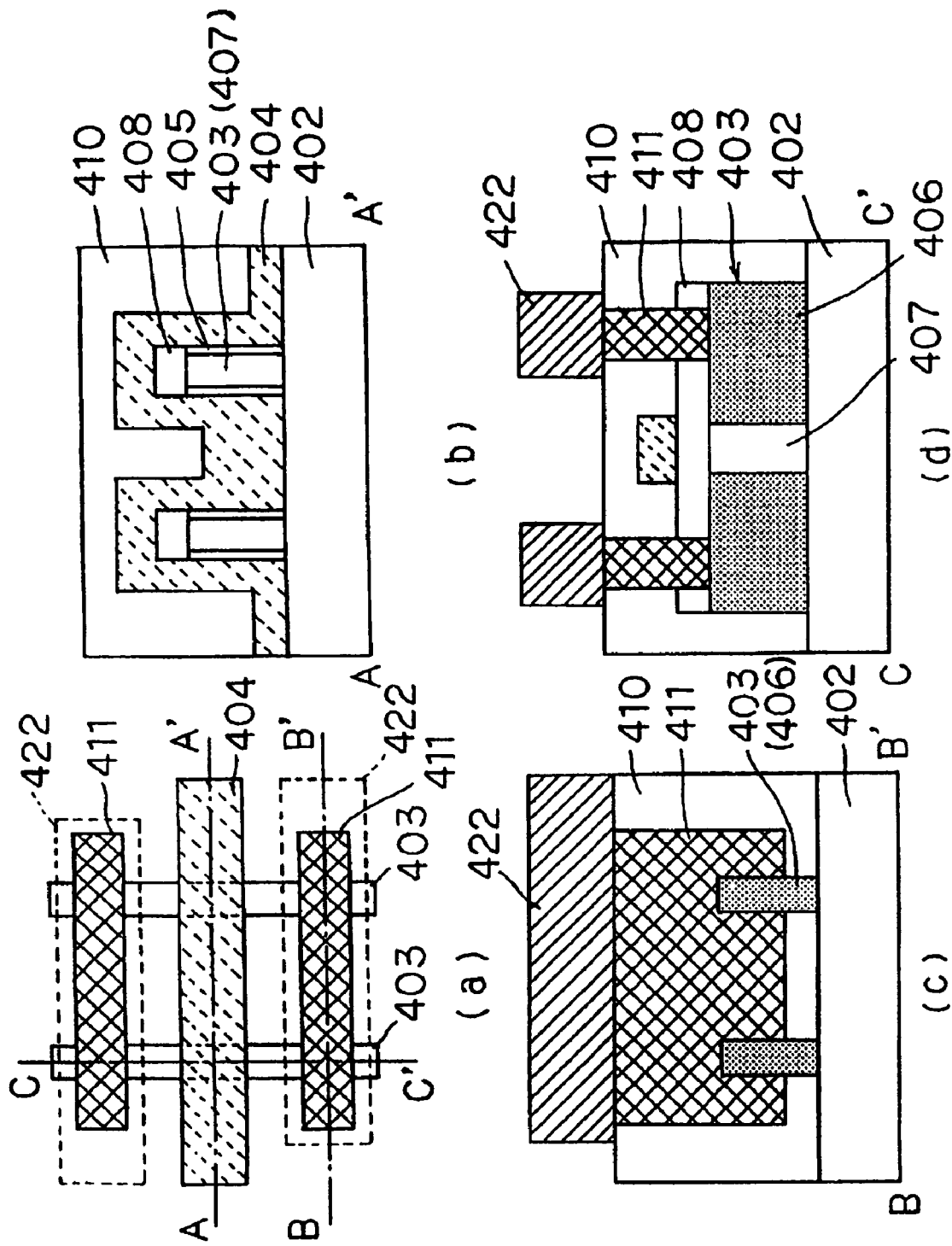

(Fig. 6)
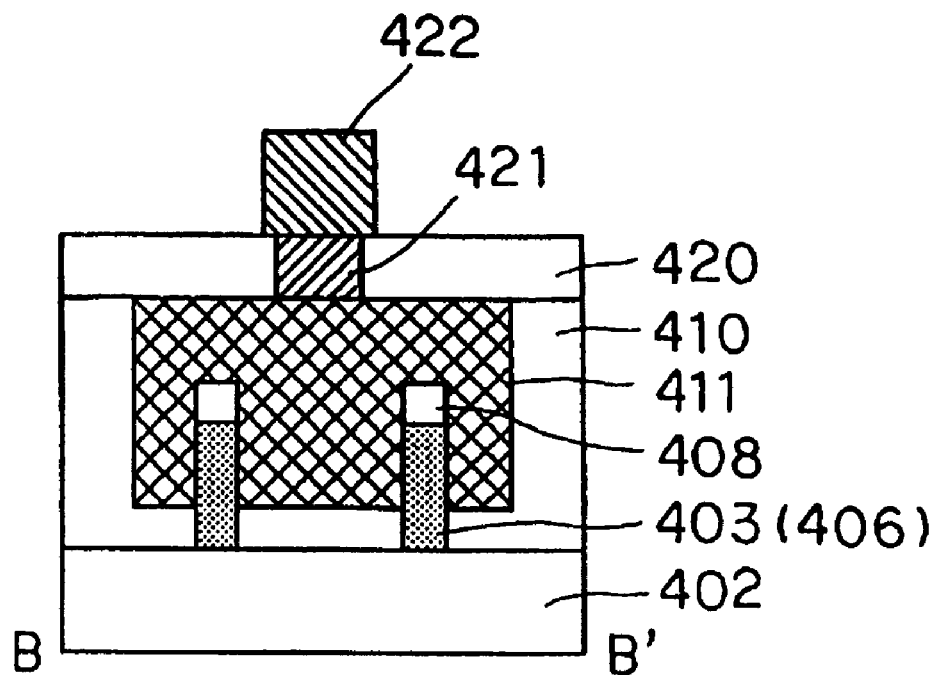
(a)
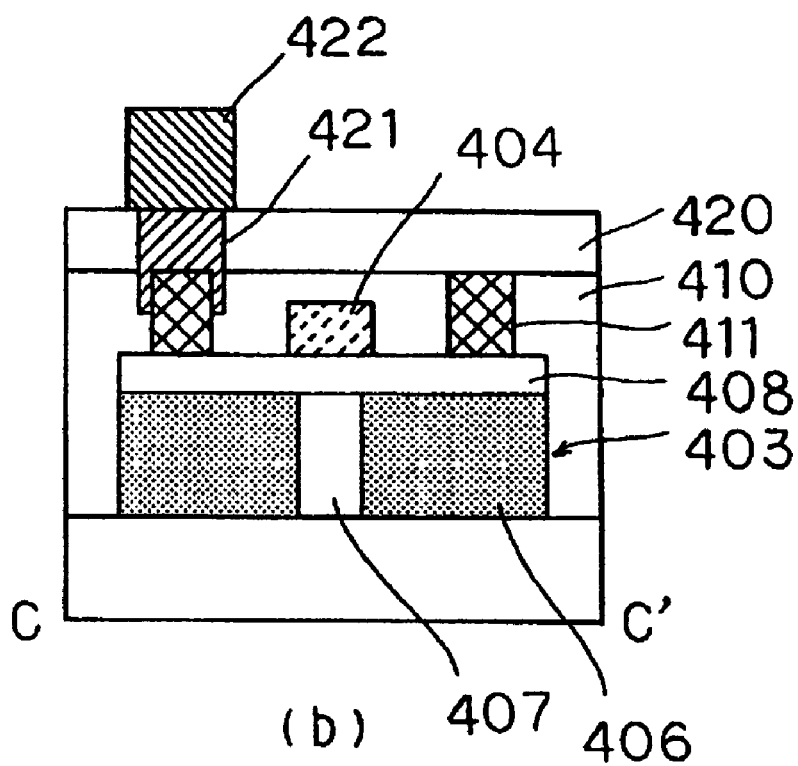
(b)

(Fig. 7)
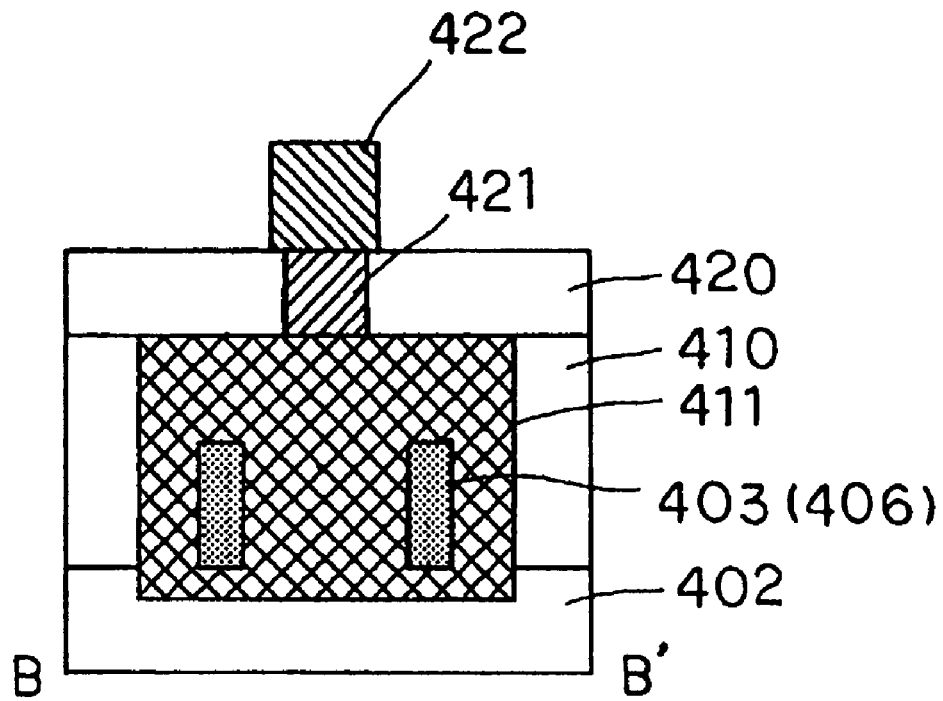
(a)
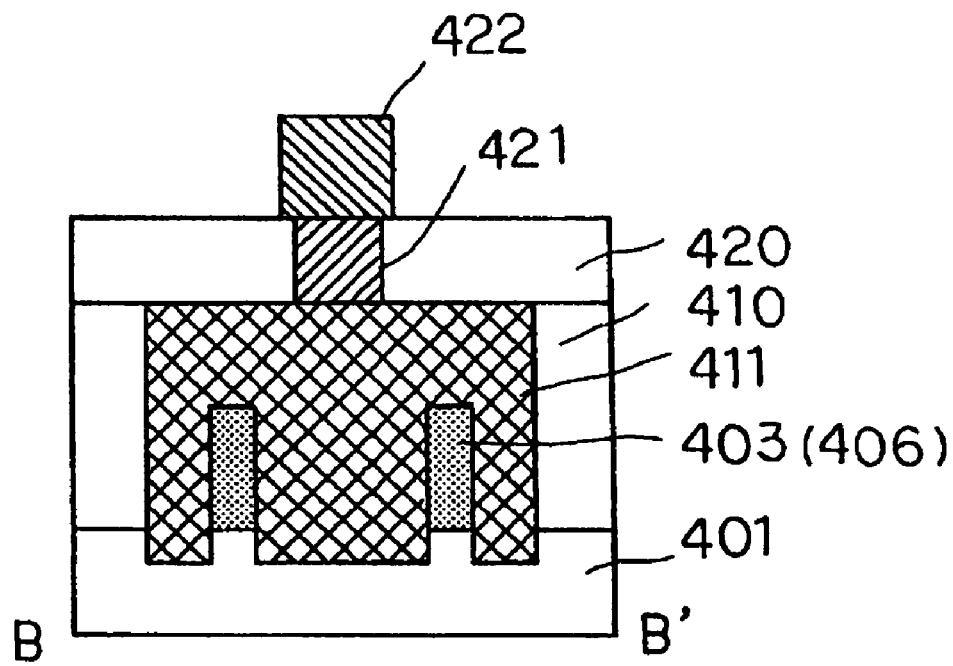
(b)

(Fig. 8)
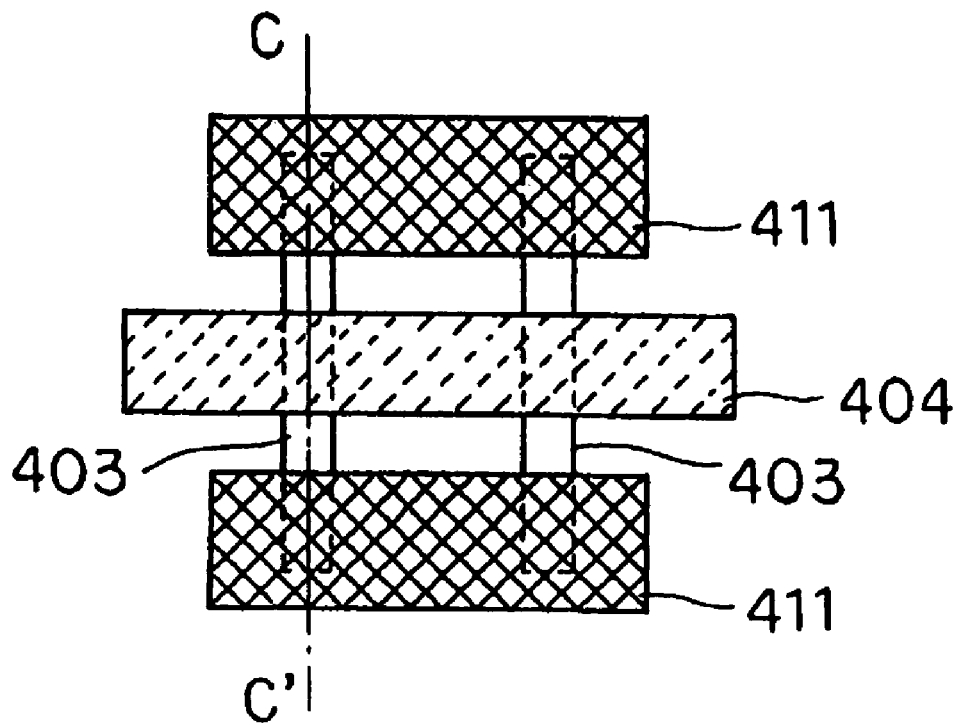
(a)
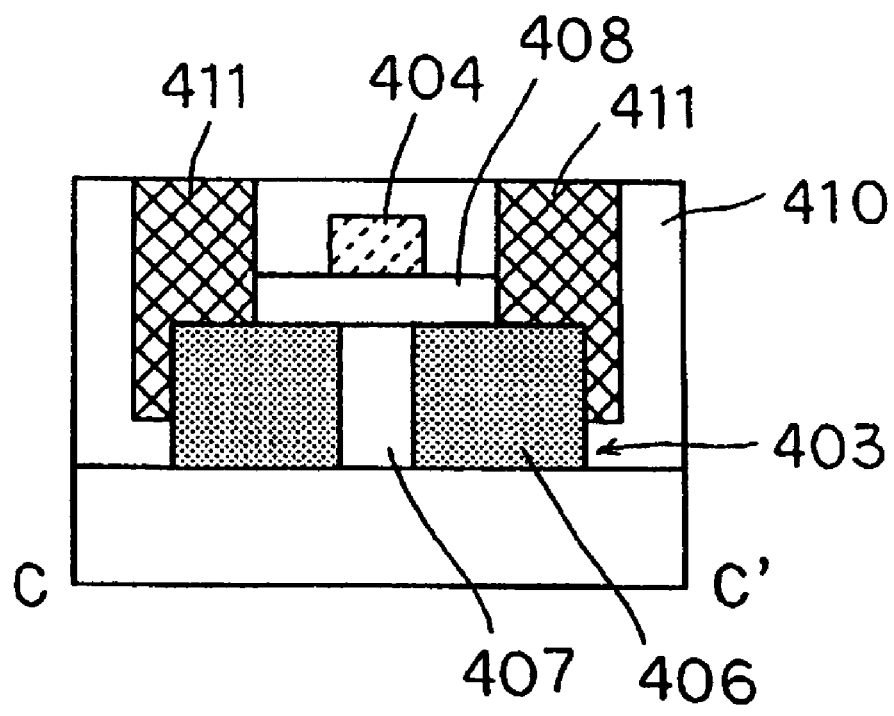
(b)

(Fig. 9)
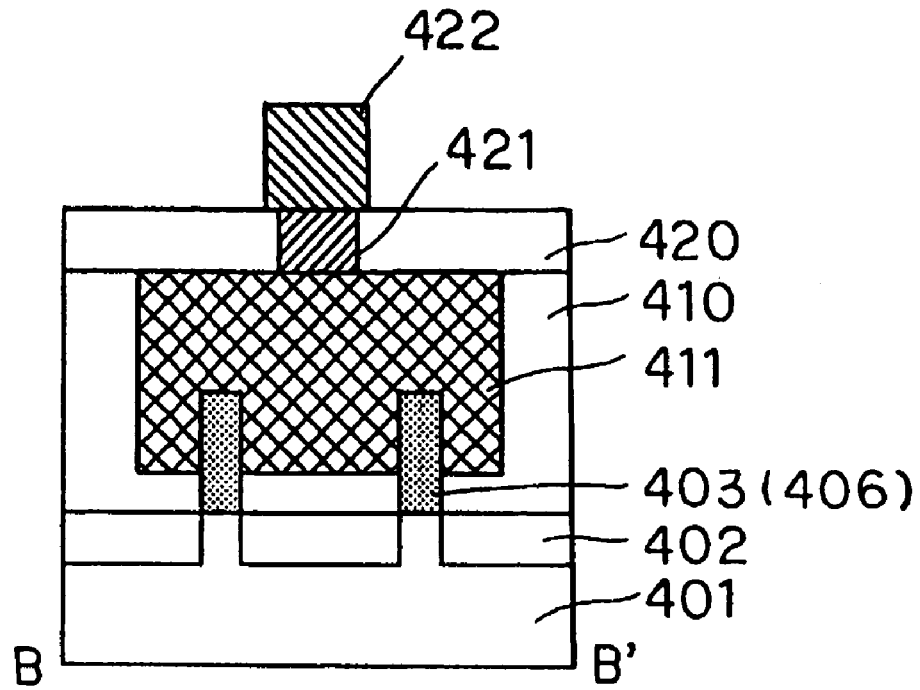
(a)
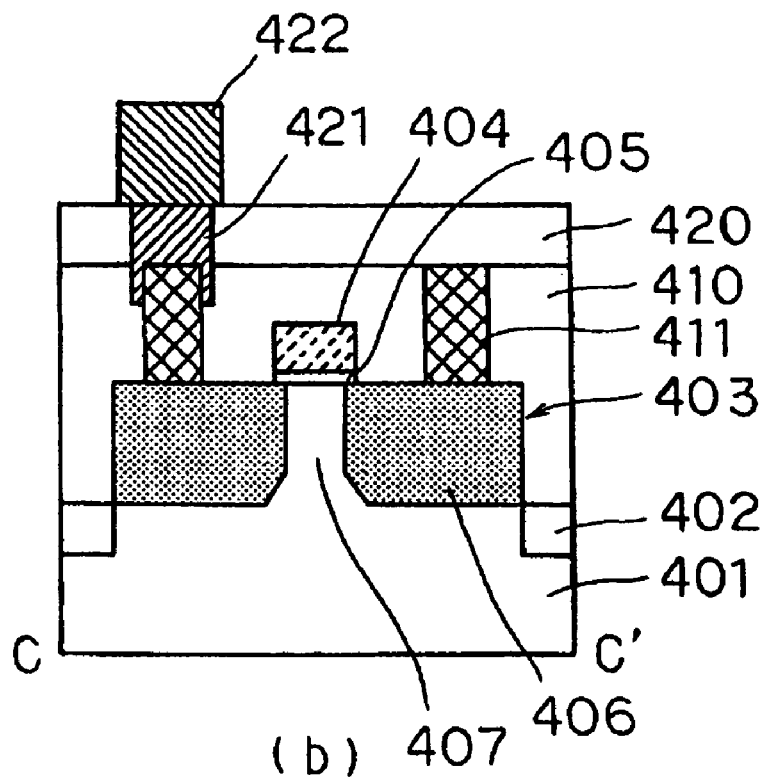
(b)

(Fig. 10)
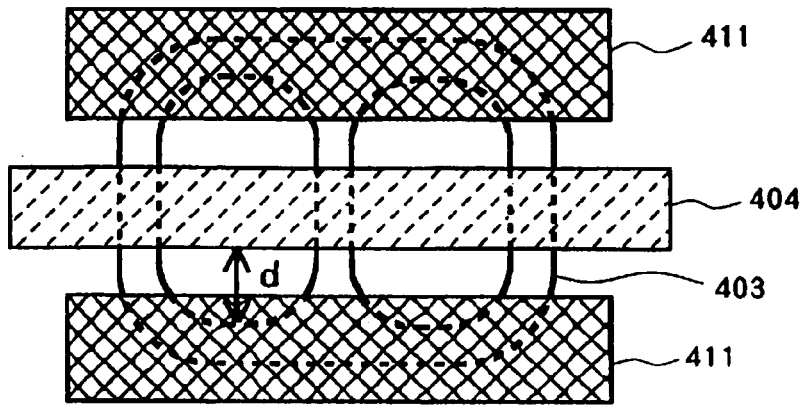
(Fig. 11)
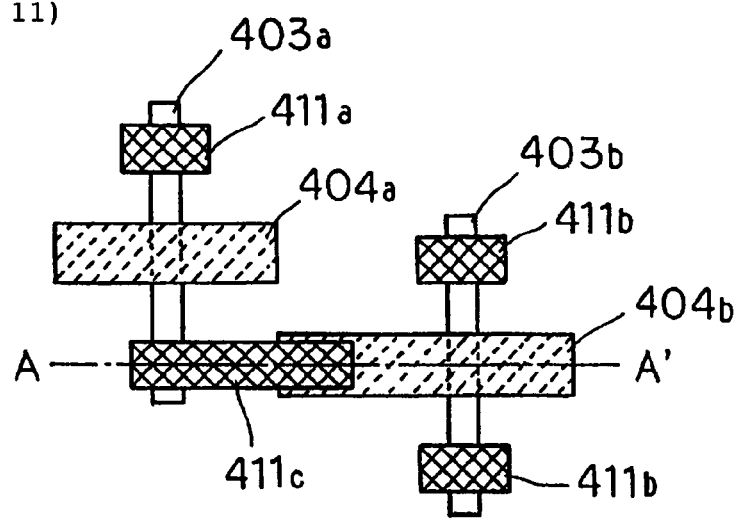
(a)
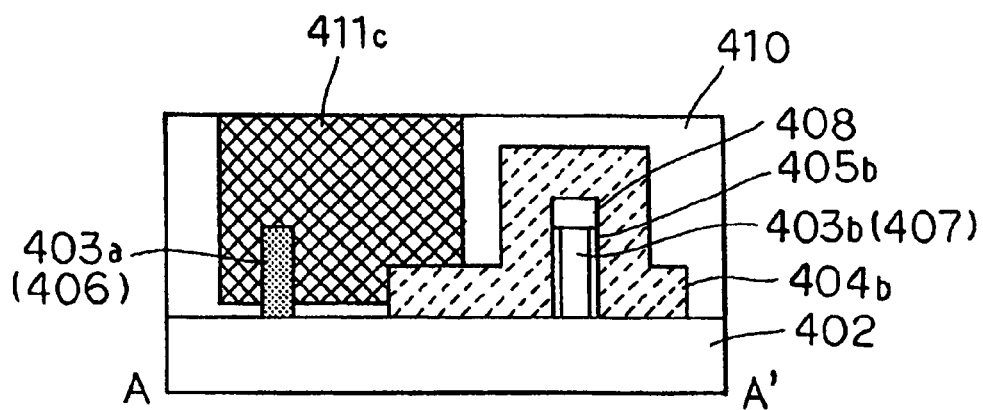
(b)

(Fig. 12)
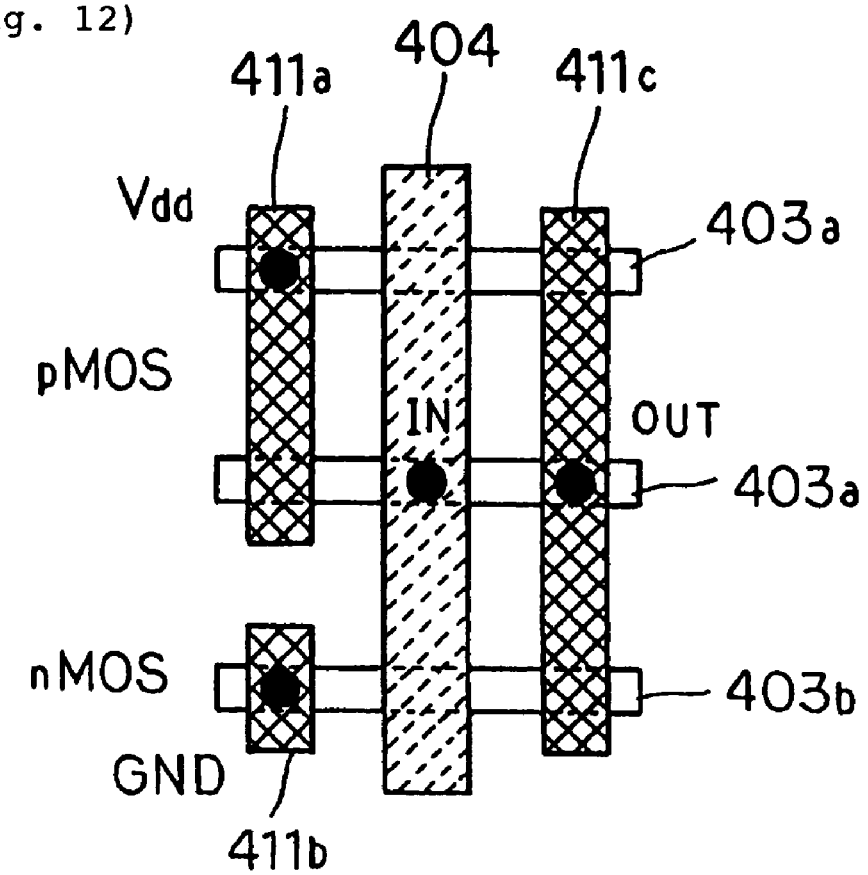
(a)
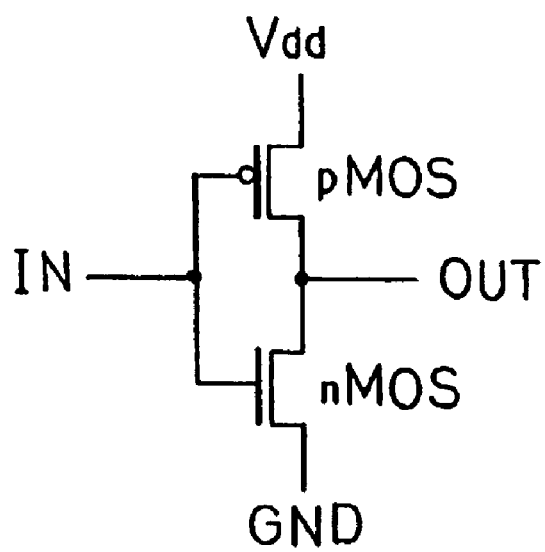
(b)

(Fig. 13)
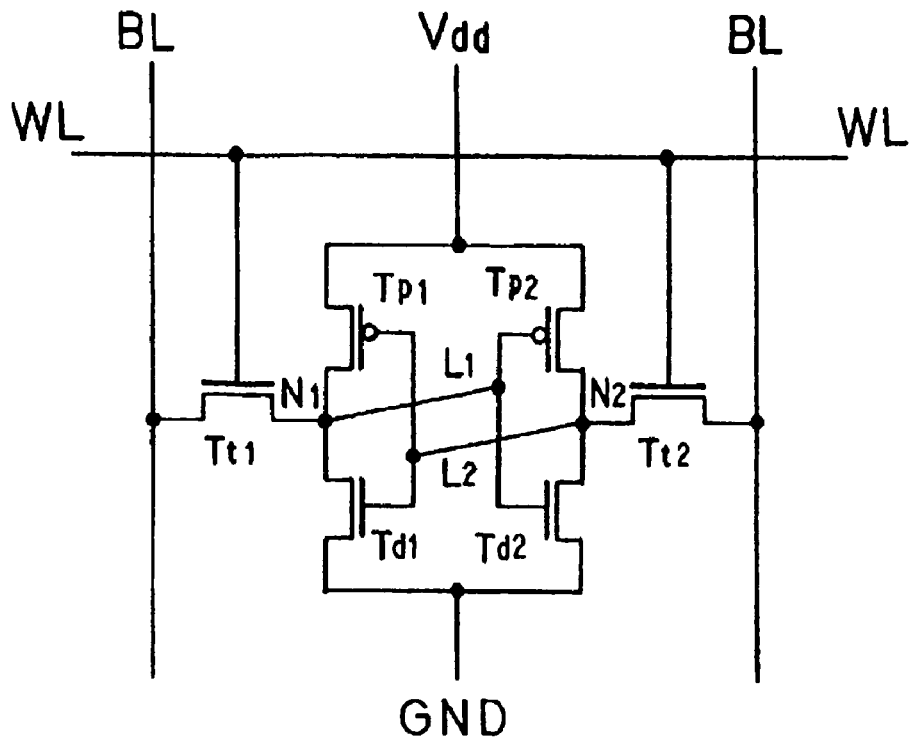
(a)
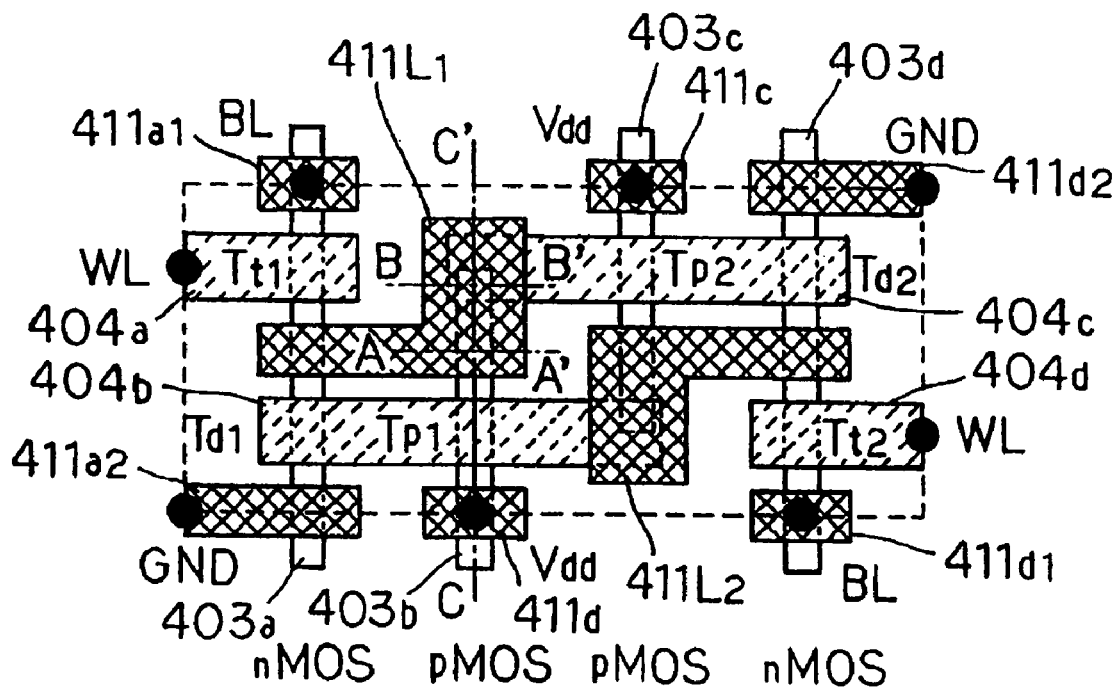
(b)

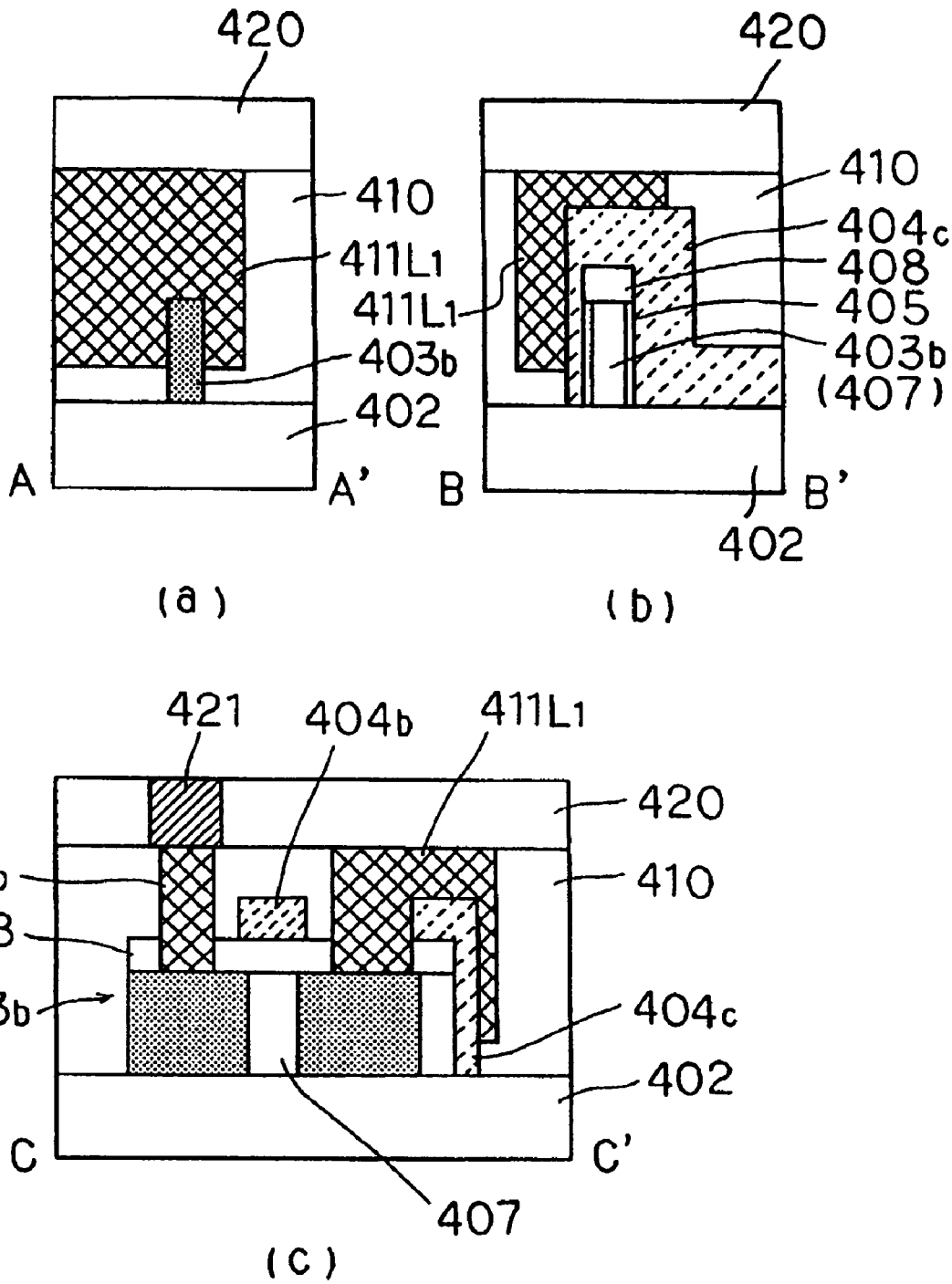
(Fig. 14)

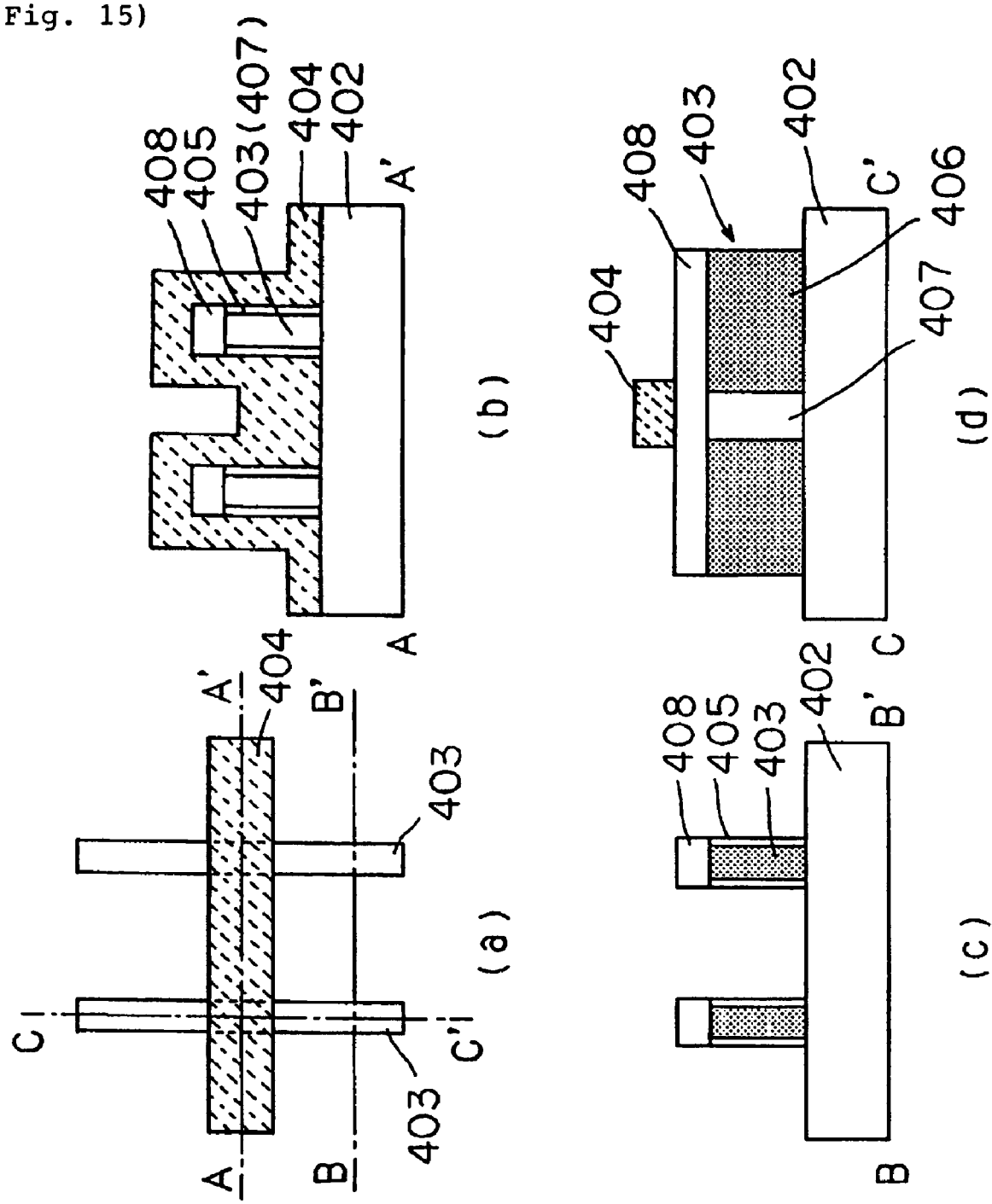
(Fig. 15)

(Fig. 16)
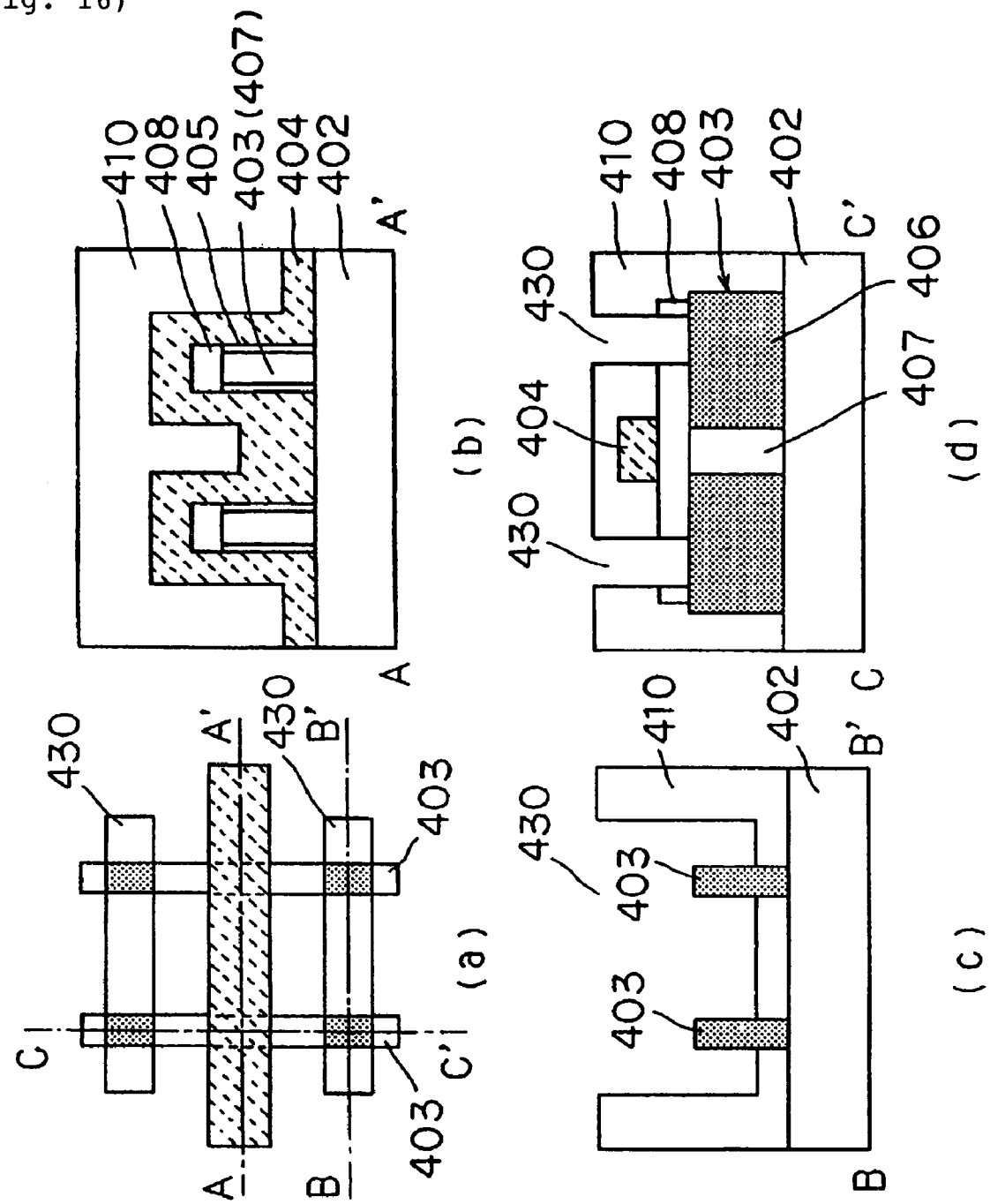

(Fig. 17)
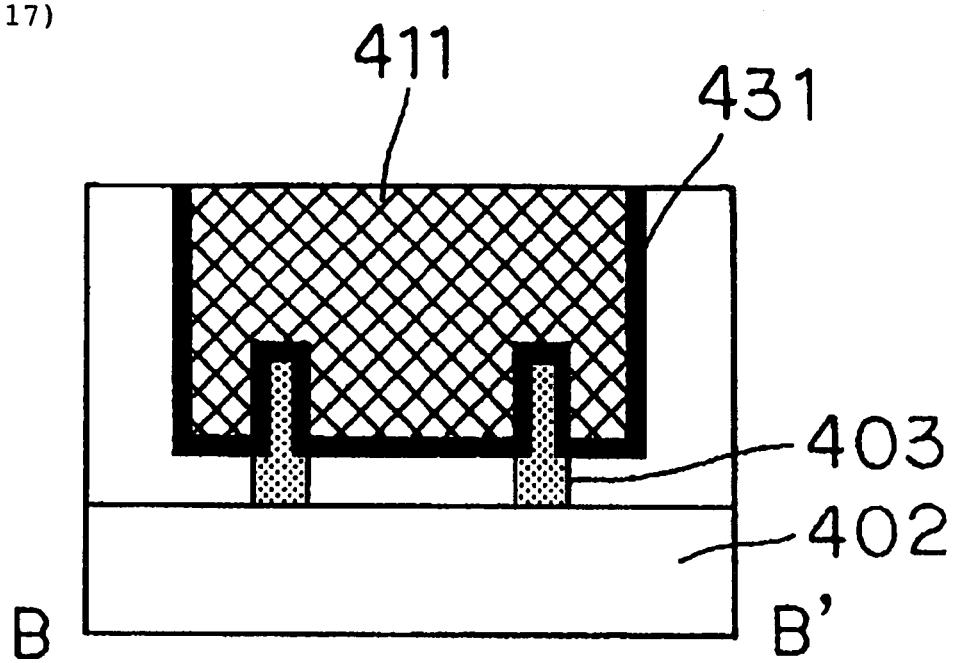
(a)
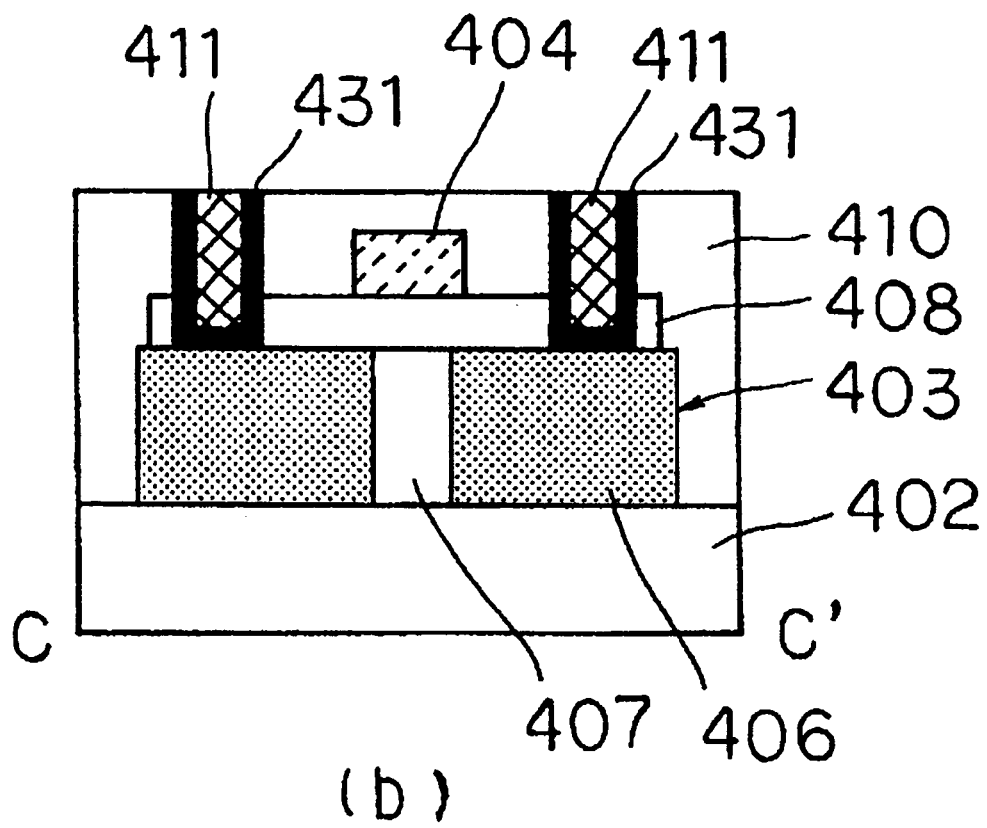
(b)

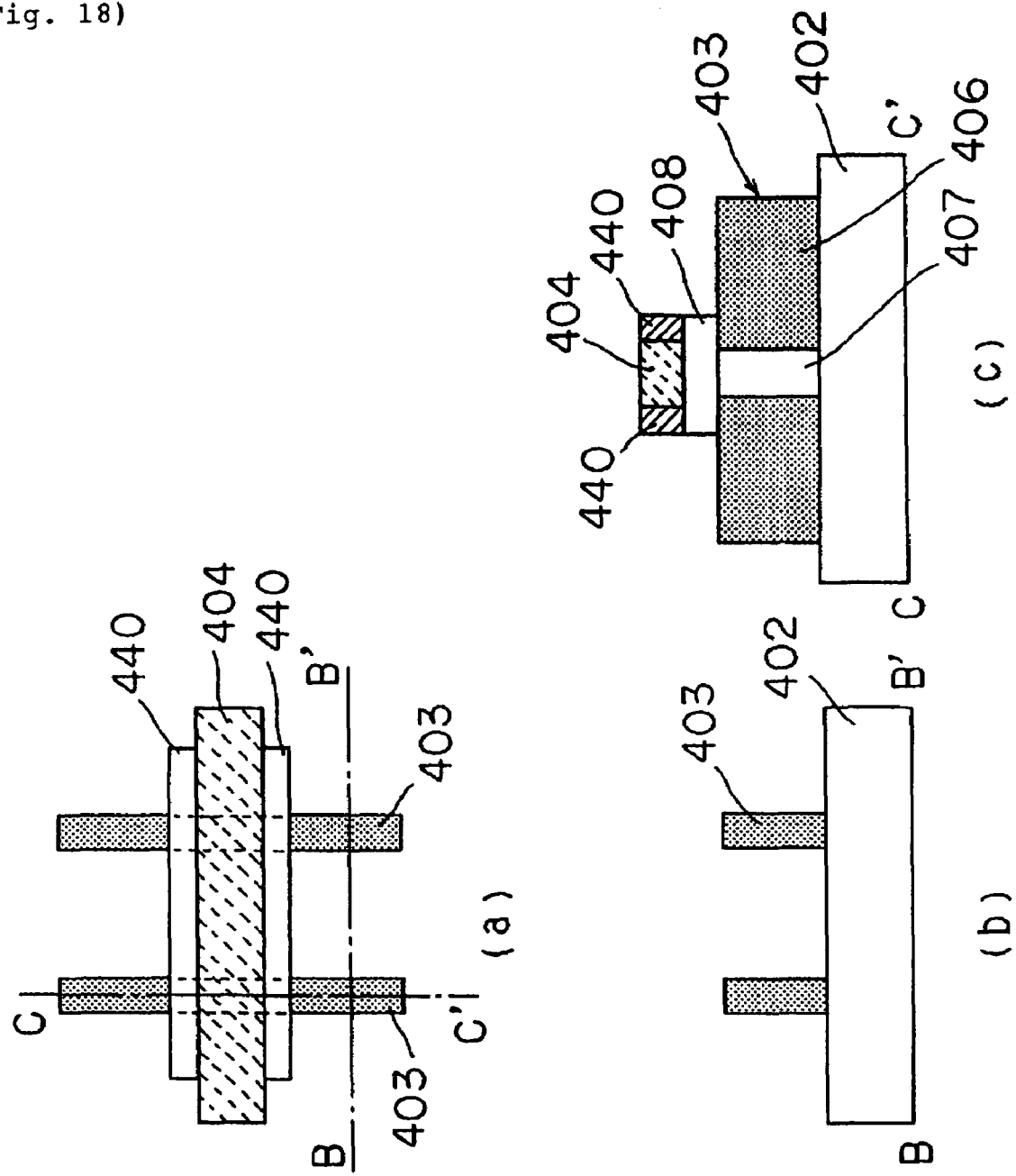
(Fig. 18)

(Fig. 19)
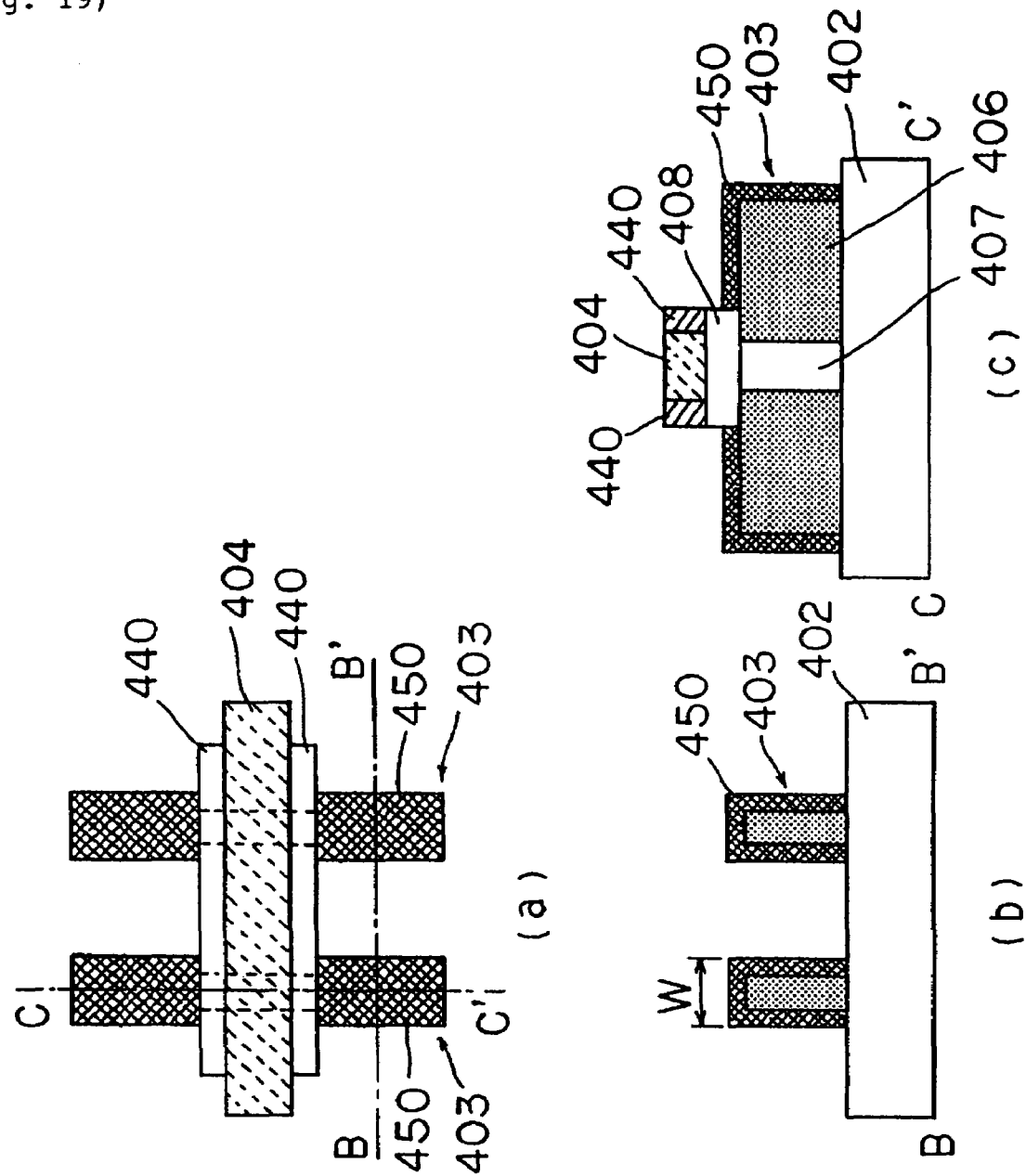

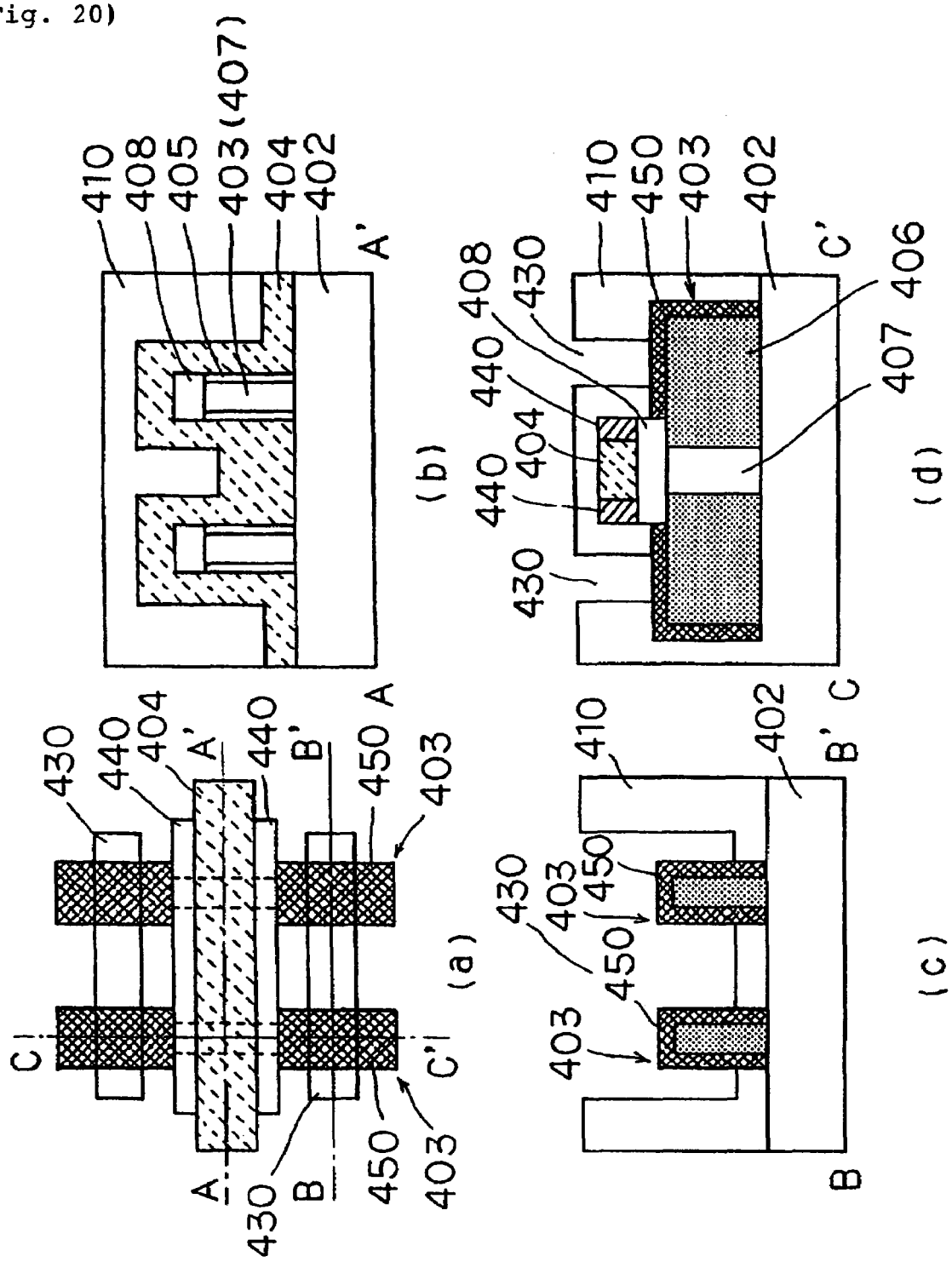
(Fig. 20)

(Fig. 21)
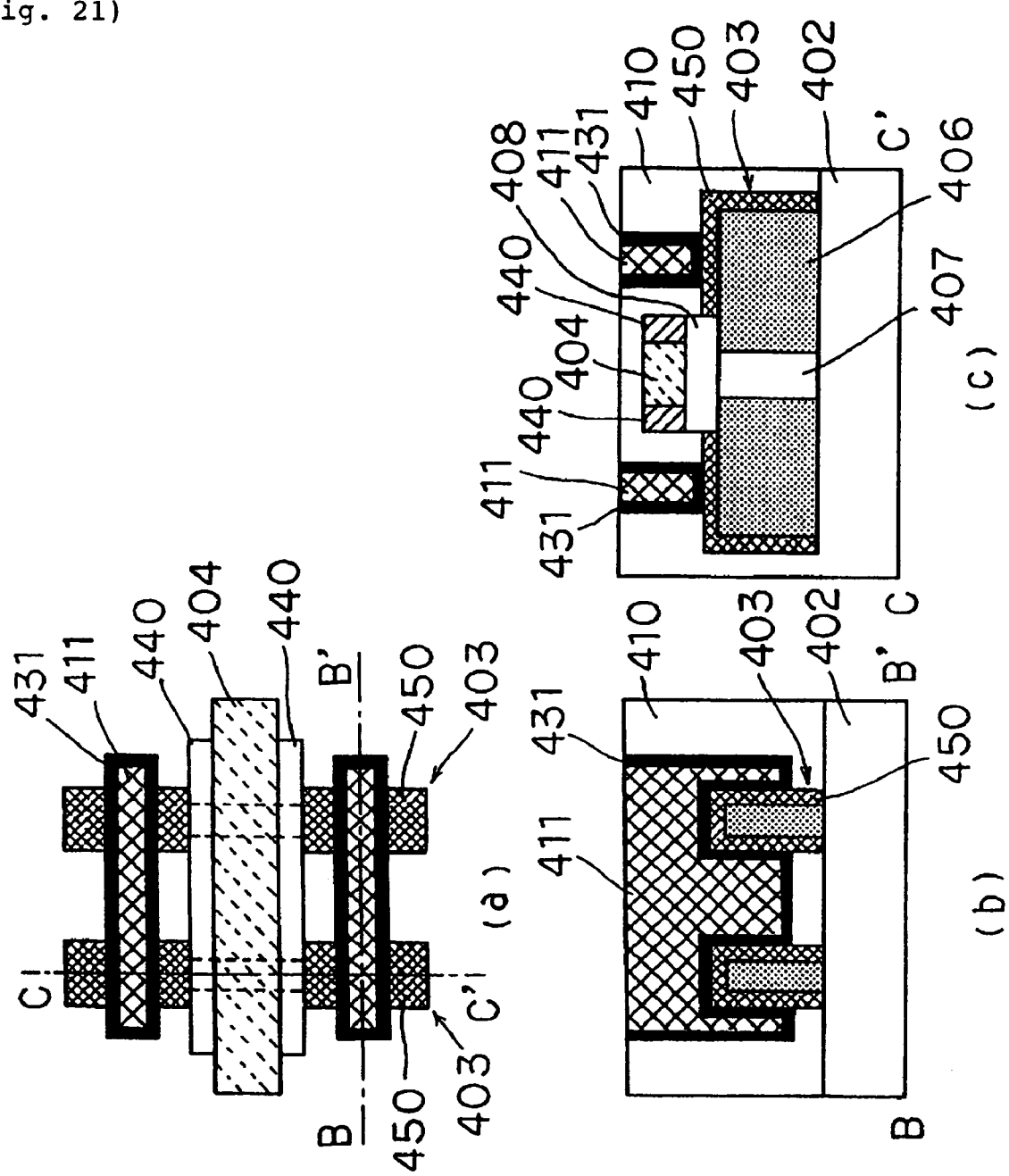

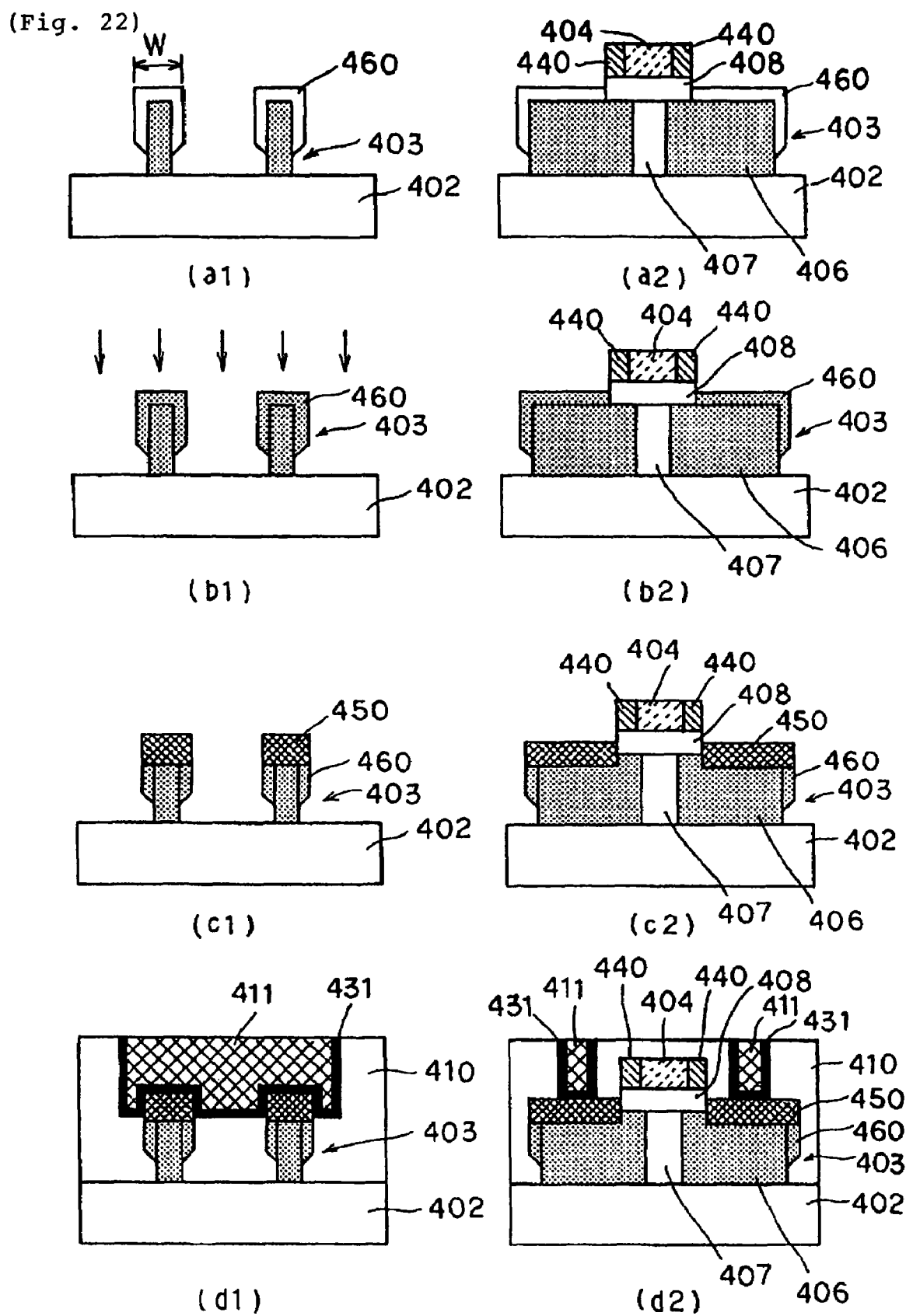
(Fig. 22)

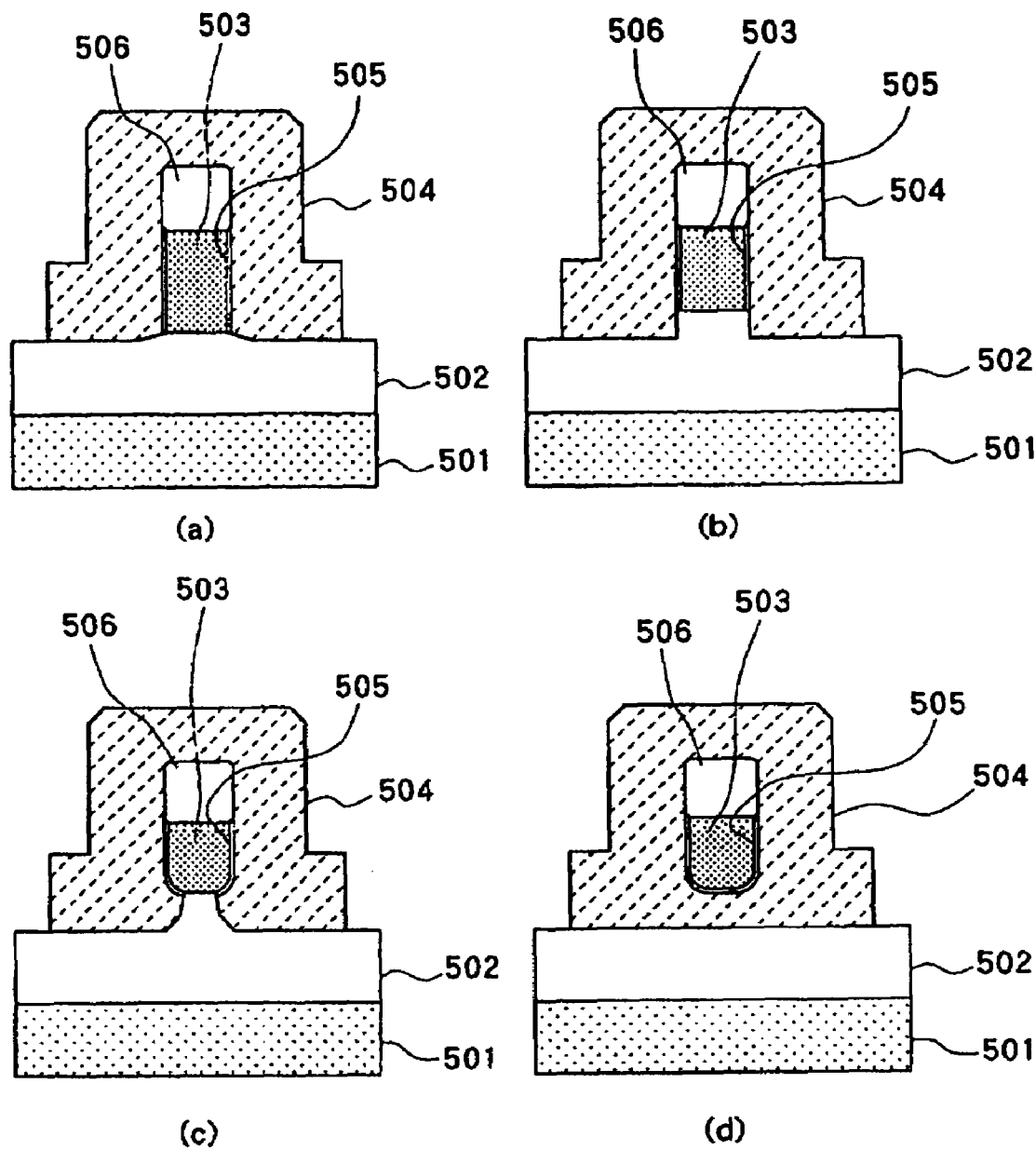
(Fig. 23)

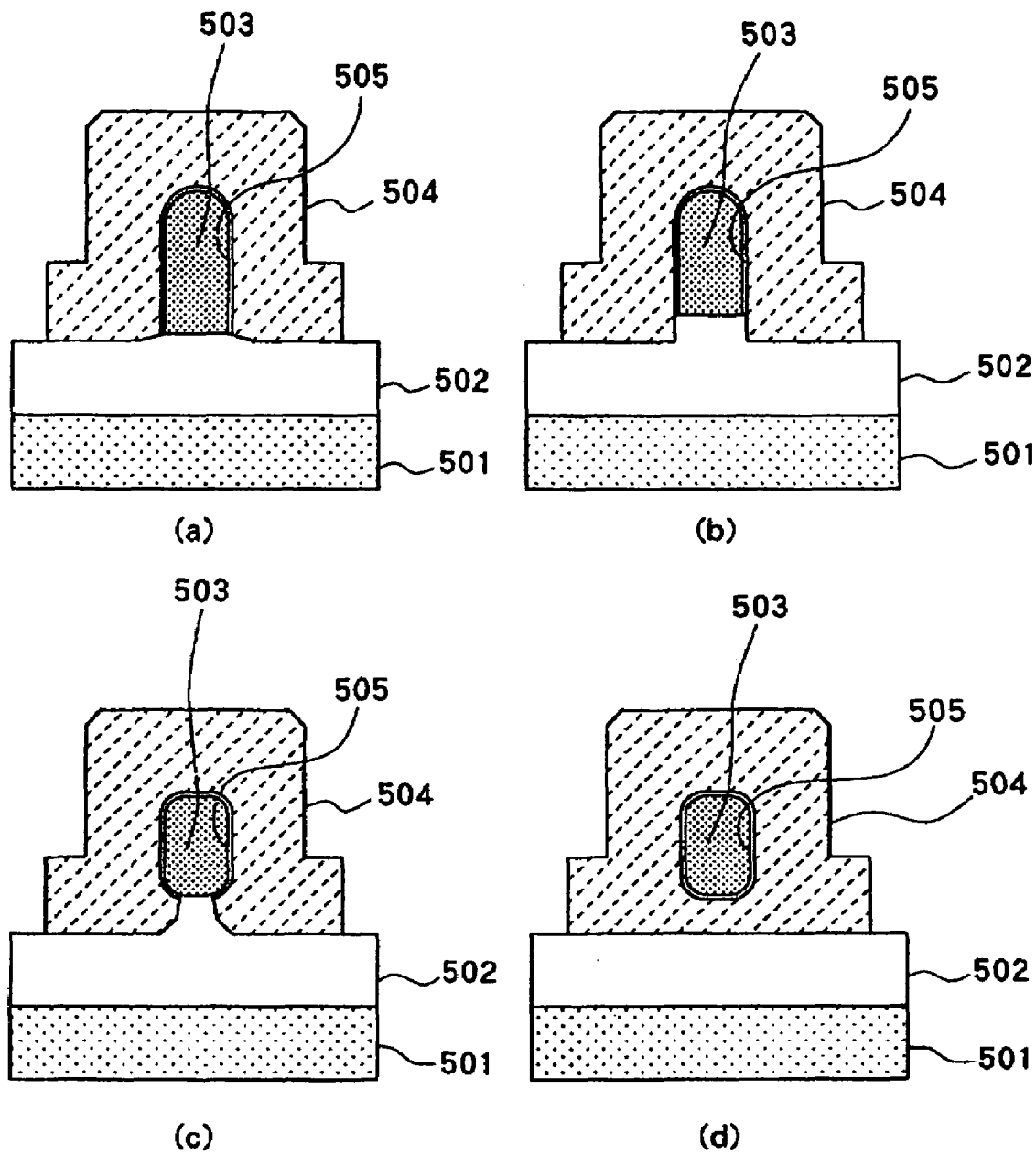
(Fig. 24)

(Fig. 25)
(a)
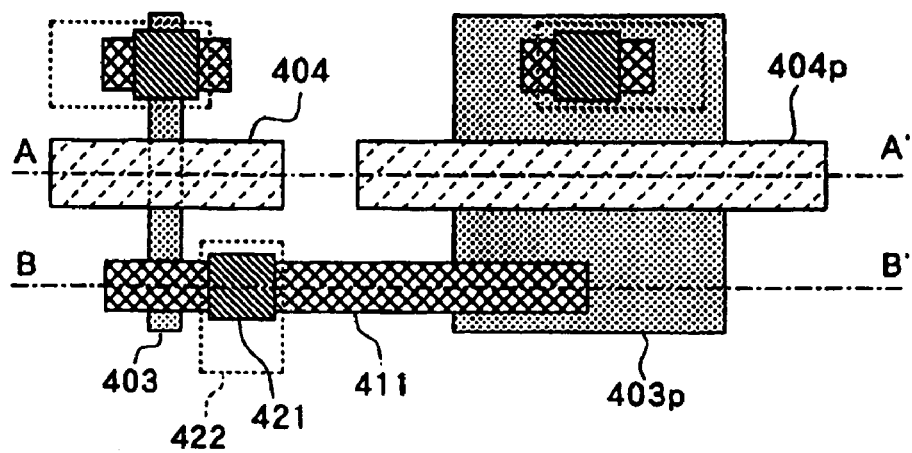
(b)
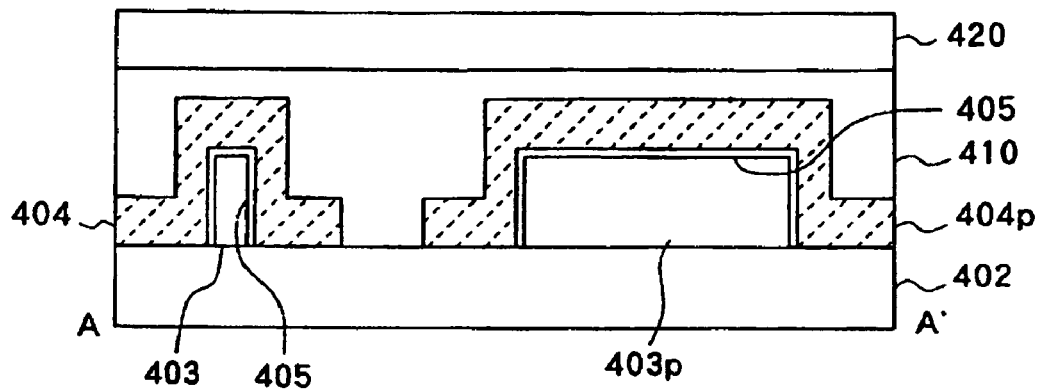
(c)
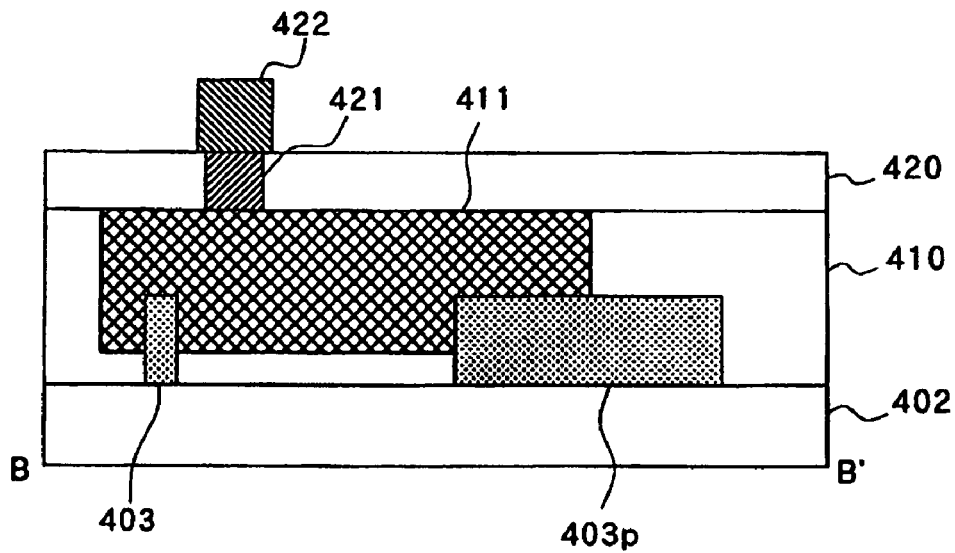

US 7,612,416 B2

SEMICONDUCTOR DEVICE HAVING A CONDUCTIVE PORTION BELOW AN INTERLAYER INSULATING FILM AND METHOD FOR PRODUCING THE SAME

TECHNICAL FIELD

The present invention relates to a semiconductor device and a method for producing the same, and particularly to a semiconductor device comprising a MIS type field effect transistor having a gate electrode on a semiconductor raised portion protruding from a substrate plane, and a method for producing the same.

BACKGROUND ART

In recent years, so called a Fin type MISFET has been proposed as one type of MIS type field effect transistors (hereinafter referred to as "MISFET"). The Fin type MISFET has a rectangular parallelepiped semiconductor raised portion, and a gate electrode is provided so as to extend over the rectangular parallelepiped semiconductor raised portion from one side face across the top face to the opposite side face of the semiconductor raised portion. A gate insulating film exists between the rectangular parallelepiped semiconductor raised portion and the gate electrode, and a channel is formed principally along the opposite side faces of the rectangular parallelepiped semiconductor raised portion. It is known that such a Fin type MISFET is advantageous for miniaturization because the channel width can be situated along a direction vertical to a substrate plane, and in addition, the Fin type MISFET is advantageous for various characteristic improvements such as improvement of a cutoff characteristic and a carrier mobility and reduction of short channel effects and punch through.

As such a Fin type MISFET, Japanese Patent Laid-Open No. 64-8670 (Patent Document 1) discloses a MOS field effect transistor (MOSFET) characterized in that a semiconductor raised portion having a source region, a drain region and a channel region has a shape of rectangular parallelepiped having side faces almost vertical to the plane of a wafer substrate, the rectangular parallelepiped raised portion has a height that is larger than the width, and a gate electrode extends along a direction vertical to the plane of the wafer substrate.

The patent document describes as an example a configuration in which a part of the rectangular parallelepiped raised portion is a part of a silicon wafer substrate and a configuration in which a part of the rectangular parallelepiped raised portion is a part of a monocrystalline silicon layer of a SOI (Silicon on insulator) substrate. The former is shown in FIG. 1(a) and the latter is shown in FIG. 1(b).

In the configuration shown in FIG. 1(a), a part of a silicon wafer substrate 101 is a rectangular parallelepiped portion 103, and a gate electrode 105 extends from one side to the other across the top of the rectangular parallelepiped portion 103. In the rectangular parallelepiped portion 103, a source region and a drain region are formed on opposite sides of the gate electrode, respectively, and a channel is formed under an insulating film 104 below the gate electrode. The channel width is two times as large as the height (h) of the rectangular parallelepiped portion 103, and the gate length is equivalent to the width (L) of the gate electrode 105. The silicon wafer substrate 101 is anisotropically etched to form a trench, and the rectangular parallelepiped portion 103 is formed of areas left on the inner side of the trench. The gate electrode 105 is provided on the insulating film 102 formed in the trench such that the gate electrode 105 extends over the rectangular parallelepiped portion 103.

In the configuration shown in FIG. 1(b), a SOI substrate consisting of a silicon wafer substrate 111, an insulating layer 112 and a silicon monocrystalline layer is prepared, the silicon monocrystalline layer is patterned into a rectangular parallelepiped portion 113, and a gate electrode 115 is provided on an exposed insulating layer 112 so as to extend over the rectangular parallelepiped portion 113. In the rectangular parallelepiped portion 113, a source region and a drain region are formed on both sides of the gate electrode, respectively, and a channel is formed under an insulating film 114 below the gate electrode. The channel width is equivalent to a sum of double the height (a) of the rectangular parallelepiped portion 113 and the width (b) thereof, and the gate length is equivalent to the width (L) of the gate electrode 115.

Japanese Patent Laid-Open No. 2002-118255 (Patent Document 2) discloses a Fin type MOSFET having a plurality of rectangular parallelepiped semiconductor raised portions (raised semiconductor layers 213) as is shown in, for example, FIGS. 2(a) to 2(c). FIG. 2(b) is a cross-sectional view taken along the B-B line in FIG. 2(a), and FIG. 2(c) is a cross-sectional view taken along the C-C line in FIG. 2(a). The Fin type MOSFET has a plurality of raised semiconductor layers 213, these raised semiconductor layers are arranged mutually in parallel, and a gate electrode 216 is provided so as to extend over the central parts of these raised semiconductor layers. The gate electrode 216 is formed along the side faces of the raised semiconductor layers 213 from the top face of the insulating film 214. An insulating film 218 exists between each raised semiconductor layer and the gate electrode, and a channel 215 is formed on the raised semiconductor layer below the gate electrode. Source and drain regions 217 are formed on each raised semiconductor layer, and high-concentration impurity layers (punch through stopper layers) are provided on regions 212 below the source and drain regions 217. Upper interconnects 229 and 330 are provided on an interlayer insulating film 226, and the upper interconnects are connected to the source and drain regions 207 and the gate electrode 216 by contact plugs 228, respectively. The patent document describes that according to the structure described above, the side face of the raised semiconductor layer can be used as the channel width, and therefore the planar area can be reduced as compared to a conventional planar type MOSFET.

If miniaturization and densification are pursued in a semiconductor device comprising a Fin type MISFET, the following problem related to connection (contact) between a source/drain region and a plug will arise.

When a contact is formed on the source/drain region of the rectangular parallelepiped semiconductor raised portion as shown in FIGS. 2(a) to 2(c), the contact area decreases as the width of the semiconductor raised portion (in the width direction in the figure) is narrowed with size reduction, so that sufficient conduction is hard to be obtained. This problem becomes more noticeable as the height of the semiconductor raised portion is increased for obtaining a large current drive force. Alignment of the semiconductor raised portion in the width direction is difficult during formation of contact holes, and connection failures resulting from misregistration tend to occur.

As shown in FIGS. 1(a) and 1(b), wide pad portions can be provided at opposite ends of the semiconductor raised portion, and contacts can be formed in the pad portions, but densification is deteriorated in proportion to the area occupied by the pad portions. It is difficult to uniform the width of the semiconductor raised portion (the width expands near the pad portion) due to influences of the pad portion when lithography or etching is performed.

DISCLOSURE OF THE INVENTION

It is an object of the present invention to provide a semiconductor device comprising a Fin type MISFET and having a structure which allows good contacts to be formed and is advantageous for miniaturization and densification.

The present invention relates to a semiconductor device comprising:

a MIS type field effect transistor which comprises a semiconductor raised portion protruding from a substrate plane, a gate electrode extending over the semiconductor raised portion from the top onto the opposite side faces of the semiconductor raised portion, a gate insulation film existing between the gate electrode and the semiconductor raised portion, and source and drain regions provided in the semiconductor raised portion;

an interlayer insulating film provided on a substrate including the transistor; and a buried conductor interconnect that is formed by filling in a trench formed in the interlayer insulating film with a conductor, wherein the buried conductor interconnect connects one of the source and drain regions of the semiconductor raised portion and another conductive portion below the interlayer insulating film.

The present invention relates to the aforementioned semiconductor device, wherein the buried conductor interconnect is connected to one of the source and drain regions of the semiconductor raised portion and another conductive portion below the interlayer insulating film, and has an upper face coplanar with the upper face of the interlayer insulating film and a lower face below the upper face of the semiconductor raised portion at an area of connection with the one of source and drain regions.

The present invention relates to the aforementioned semiconductor device, wherein the buried conductor interconnect is in contact with opposite side faces of the semiconductor raised portion at an area of connection with the one of source and drain regions.

The present invention relates to the aforementioned semiconductor device, wherein the semiconductor device comprises a first transistor and a second transistor as the MIS type field effect transistor, and the buried conductor interconnect is connected to one of source and drain regions of the first transistor and a gate electrode or one of source and drain regions of the second transistor as the another conductive portion.

The present invention relates to the aforementioned semiconductor device, wherein the semiconductor device comprises, as the MIS type field effect transistor, a transistor comprising a plurality of semiconductor raised portions protruding from a substrate plane, a gate electrode formed of a conductor provided over the plurality of semiconductor raised portions and extending from the top to the opposite side faces of each semiconductor raised portion, a gate insulating film existing between the gate electrode and each semiconductor raised portion, and source and drain regions provided in each semiconductor raised portions, and in the transistor, the buried conductor interconnect is connected to one of source and drain regions of one semiconductor raised portion and one of source and drain regions of another semiconductor raised portion as the another conductive portion.

The present invention relates to the aforementioned semiconductor device, wherein the plurality of semiconductor raised portions are arranged mutually in parallel.

The present invention relates to the aforementioned semiconductor device, wherein the buried conductor interconnect is connected through a plug or directly to the upper interconnect.

The present invention relates to the aforementioned semiconductor device, wherein the buried conductor interconnect and one of the source and drain regions are connected through a resistance lowering layer made of a metal or a metallic compound.

The present invention relates to the aforementioned semiconductor device, wherein the semiconductor raised portion has a part where width W of the part along a direction parallel to the substrate plane and vertical to the channel length direction is larger than width W of a part below the gate electrode at least at an area of connection between one of the source and drain regions of the semiconductor raised portion and the buried conductor interconnect.

The present invention relates to the aforementioned semiconductor device, wherein the semiconductor device comprises, as the MIS type field effect transistor, a first conductivity type transistor and a second conductivity type transistor that constitute a CMOS inverter, gate electrodes of the first conductivity type transistor and the second conductivity type transistor are formed of a common conductor, and the conductor is connected to an input node, and the buried conductor interconnect is connected to a drain region of the first conductivity type transistor and a drain region of the second conductivity type transistor, and is connected to an output node.

The present invention relates to a semiconductor device comprising a SRAM cell unit having a pair of first and second drive transistors, a pair of first and second load transistors and a pair of first and second transfer transistors, wherein each of the transistors comprises a semiconductor raised portion protruding from a substrate plane, a gate electrode extending over the semiconductor raised portion from the top onto the opposite side faces of the semiconductor raised portion, a gate insulating film existing between the gate electrode and the semiconductor raised portion, and source and drain regions provided in the semiconductor raised portion;

the semiconductor raised portions of the transistors are arranged with their longitudinal direction extending along a first direction;

the first drive transistor and the first transfer transistor have a common first semiconductor raised portion, the second drive transistor and the second transfer transistor have a common second semiconductor raised portion, the first load transistor has a third semiconductor raised portion adjacent to the first semiconductor raised portion, and the second load transistor has a fourth semiconductor raised portion adjacent to the second semiconductor raised portion; and the gate electrodes of the first drive transistor and the first load transistor are formed of a common first conductor, the gate electrodes of the second drive transistor and the second load transistor are formed of a common second conductor, and the conductors are arranged with their longitudinal direction extending along a second direction vertical to the first direction.

The present invention relates to the aforementioned semiconductor device comprising:

an interlayer insulating film provided on a substrate including the SRAM cell unit;

a first buried conductor interconnect connected to the first conductor, the drain region of the second load transistor, the drain region of the second drive transistor and one of the source and drain regions of the second transfer transistor, and formed on the interlayer insulating film; and a second buried conductor interconnect connected to the second conductor, the drain region of the first load transistor, the drain region of the first drive transistor and one of the source and drain regions of the first transfer transistor, and formed on the interlayer insulating film.

The present invention relates to the aforementioned semiconductor device, wherein each of the first and second buried conductor interconnects has an upper face coplanar with the upper face of the interlayer insulating film and a lower face below the upper face of the semiconductor raised portion at areas of connection with the source regions and the one of source and drain regions.

The present invention relates to the aforementioned semiconductor device, wherein the first and second buried conductor interconnects are in contact with opposite side faces of the semiconductor raised portions at areas of connection with the source region and the one of source and drain regions.

The present invention relates to the aforementioned semiconductor device comprising, as the transistor, a transistor comprising a plurality of semiconductor raised portions protruding from a substrate plane, a gate electrode formed of a conductor provided over the plurality of semiconductor raised portions and extending the top to the opposite side faces of each semiconductor raised portion, a gate insulating film existing between the gate electrode and each semiconductor raised portion, and source and drain regions provided in each semiconductor raised portion.

The present invention relates to a method for producing a semiconductor device comprising a MIS type field effect transistor which comprises a semiconductor raised portion protruding from a substrate plane, a gate electrode extending over the semiconductor raised portion from the top onto the opposite side faces of the semiconductor raised portion, a gate insulating film existing between the gate electrode and the semiconductor raised portion, and source and drain regions provided in the semiconductor raised portion, the method comprising the steps of:

forming the MIS type field effect transistor;

forming an interlayer insulating film so as to bury the semiconductor raised portion;

forming a trench in the interlayer insulating film so as to expose at least a part of one of the source and drain regions provided in the semiconductor raised portion and another conductive portion to be conducted to the one of source and drain regions in the trench; and filling in the trench with a conductor to form a buried conductor interconnect that is connected to the one of source and drain regions and the another conductive portion.

The present invention relates to the aforementioned method for producing a semiconductor device, wherein the another conductive portion is a gate electrode or one of source and drain regions of another transistor.

The present invention relates to the aforementioned method for producing a semiconductor device, wherein the MIS type field effect transistor comprises a plurality of semiconductor raised portions protruding from a substrate surface, a gate electrode formed of a conductor provided over the plurality of semiconductor raised portions and extending from the top to the opposite side faces of each semiconductor raised portion, a gate insulating film existing between the gate electrode and each semiconductor raised portion, and source and drain regions provided in each semiconductor raised portion, and in the step of forming a trench, at least a part of each one of the source and drain regions provided in the semiconductor raised portions to be mutually conducted is exposed, and a conductor is filled in the trench to form a buried conductor interconnect that is connected to the source/drain region of one semiconductor raised portion and the source/drain regions of other semiconductor raised portions in the transistor.

The present invention relates to the aforementioned method for producing a semiconductor device, comprising a step of epitaxially growing Si on the surface of the semiconductor raised portion before forming the interlayer insulating film.

The present invention relates to the aforementioned method for producing a semiconductor device, comprising a step of forming a resistance lowering layer made of a metal or a metallic compound on the semiconductor raised portion before forming the interlayer insulating film.

The present invention relates to the aforementioned method for producing a semiconductor device, comprising a step of epitaxially growing Si on the surface of the semiconductor raised portion exposed in the trench after forming the trench.

The present invention relates to the aforementioned method for producing a semiconductor device, comprising a step of forming a resistance lowering layer made of a metal or a metallic compound on the semiconductor raised portion exposed in the trench after forming the trench.

According to the present invention, a semiconductor device comprising a Fin type MISFET and having a structure which allows good contacts to be formed and is advantageous for miniaturization and densification can be provided.

BRIEF DESCRIPTION OF THE DRAWINGS

FIGS. 1(a) and 1(b) are explanatory views of the element structure of a conventional Fin type MISFET;

FIGS. 2(a) to 2(c) are explanatory views of the element structure of the conventional Fin type MISFET;

FIG. 3 is an explanatory view of a Fin type MISFET in the present invention;

FIGS. 4(a) to 4(e) are explanatory views of a semiconductor device according to the present invention;

FIGS. 5(a) to 5(d) are explanatory views of another semiconductor device according to the present invention;

FIGS. 6(a) and 6(b) are explanatory views of another semiconductor device according to the present invention;

FIGS. 7(a) and 7(b) are explanatory views of another semiconductor device according to the present invention;

FIGS. 8(a) and 8(b) are explanatory views of another semiconductor device according to the present invention;

FIGS. 9(a) and 9(b) are explanatory views of another semiconductor device according to the present invention;

FIG. 10 is an explanatory view of another semiconductor device according to the present invention;

FIGS. 11(a) and 11(b) are explanatory views of another semiconductor device according to the present invention;

FIGS. 12(a) and 12(b) are explanatory views of another semiconductor device according to the present invention;

FIGS. 13(a) and 13(b) are explanatory views of another semiconductor device according to the present invention;

FIGS. 14(a) to 14(c) are explanatory views of another semiconductor device according to the present invention;

FIGS. 15(a) to 15(d) are explanatory views of a method for producing a semiconductor device according to the present invention;

FIGS. 16(a) to 16(d) are explanatory views of the method for producing a semiconductor device according to the present invention;

FIGS. 17(a) and 17(b) are explanatory views of the method for producing a semiconductor device according to the present invention;

FIGS. 18(a) to 18(c) are explanatory views of the method for producing a semiconductor device according to the present invention;

FIGS. 19(a) to 19(c) are explanatory views of the method for producing a semiconductor device according to the present invention;

FIGS. 20(a) to 20(d) are explanatory views of the method for producing a semiconductor device according to the present invention;

FIGS. 21(a) to 21(c) are explanatory views of the method for producing a semiconductor device according to the present invention;

FIGS. 22(a1) and 22(a2), 22(b1) and 22(b2), 22(c1) and 22(c2), and 22(d1) and 22(d2) are explanatory views of the method for producing a semiconductor device according to the present invention;

FIGS. 23(a) to 23(d) are explanatory views of other Fin type MISFETs according to the present invention;

FIGS. 24(a) to 24(d) are explanatory views of other Fin type MISFETs according to the present invention; and FIGS. 25(a) to 25(c) are explanatory views of another semiconductor device according to the present invention.

BEST MODE FOR CARRYING OUT THE INVENTION

The present invention relates to a semiconductor device comprising a Fin type MISFET that comprises a semiconductor raised portion 303, a gate electrode 304 extending over the semiconductor raised portion 303 from the top to the opposite side faces of the semiconductor raised portion, and an insulating film 305 existing between the gate electrode 304 and the semiconductor raised portion 303, and source and drain regions 306 provided in the semiconductor raised portion 303, as shown, for example, FIG. 3.

The semiconductor raised portion of the Fin type MISFET in the present invention protrudes with respect to the substrate plane (in this case, flat surface of an insulator), and may be formed with a semiconductor layer provided on a base insulating film 302 on a semiconductor substrate 301 as shown in, for example, FIG. 3. In the present invention, the "substrate plane" means any plane parallel to the substrate surface. This base insulating film may be a support substrate.

The semiconductor raised portion may be formed with a part of the semiconductor substrate below the base insulating film as will be described later. This structure is advantageous in the heat release characteristic and inhibition of substrate flotation effects because heat and electric charges generated at the semiconductor raised portion by driving of the element can be allowed to escape to the semiconductor substrate. The semiconductor raised portion formed with the semiconductor layer provided on the base insulating film 302 and the semiconductor raised portion formed as a part of the semiconductor substrate below the base insulating film may coexist on the same semiconductor substrate. The semiconductor raised portion preferably has a shape of substantially rectangular parallelepiped, but may have a shape altered from the shape of rectangular parallelepiped as long as accuracy of processing and desired element characteristics can be obtained.

As a material of the semiconductor raised portion, silicon, silicon-germanium or germanium may suitably be used. A multilayered film of the aforementioned materials may be used as required. For opposite side faces of the semiconductor raised portion, the {100} plane, the {110} plane and the {111} plane may suitably be used because of high mobility and easy formation of a flat gate insulating film.

In the Fin type MISFET in the present invention, the gate electrode extends over the semiconductor raised portion from the top onto the opposite side faces of the semiconductor raised portion, and an insulating film exists between the gate electrode and the semiconductor raised portion. On areas of the semiconductor raised portion below the gate electrode, channels are formed by application of a voltage to the gate electrode; and usually impurities of a relatively low concentration or no impurities are introduced in the channel region, depending on a predetermined threshold voltage. When the insulating film existing between each side face (face in a direction vertical to the substrate plane) of the semiconductor raised portion and the gate electrode is a gate insulating film, channels can be formed on both side faces of the semiconductor raised portion. When the insulating film existing between the top face of the semiconductor raised portion and the gate electrode is a gate insulating film that is as thin as the insulating film on the side face, a channel can also be formed on the top face of the semiconductor raised portion. By providing a thick insulating film (cap insulating film) on the top face of the semiconductor raised portion, formation of a channel on the top face of the semiconductor raised portion can be prevented. The cap insulating film on the top face of the semiconductor raised portion may be formed from a material different from the material of the insulating films on the side faces, or may be formed separately from the insulating films on the side faces.

FIGS. 23(a) to 23(d) and 24(a) to 24(d) show a sectional shape of the area of the semiconductor raised portion below the gate electrode. Reference numeral 501 denotes a semiconductor layer, reference numeral 502 denotes a base insulating layer, reference numeral 503 denotes a semiconductor raised portion, reference numeral 504 denotes a gate electrode, reference numeral 505 denotes a gate insulating film, and reference numeral 506 denotes a cap insulating film.

The cap insulating film 506 that is thicker than the gate insulating film 505 may be placed on the top face of the semiconductor raised portion 503 as shown in FIGS. 23(a) to 23(d), or no cap insulating film 506 may be placed as shown in FIGS. 24(a) to 24(d), and a selection may appropriately be made on whether the cap insulating film 506 is placed or not.

As shown in FIGS. 24(a) to 24(d), the corners of the semiconductor raised portion may be rounded, so that centralization of electric fields during operation of the element can be inhibited.

In the normal structure in FIGS. 23(a), the lower end of the semiconductor raised portion 503 and the lower end of the gate electrode are almost coplanar, whereas in the structure in FIG. 23(b), the lower end of the gate electrode 504 extends below the lower end of the semiconductor raised portion 503. This structure, which is called a "π gate structure" because the gate electrode has a shape similar to a Greek letter "π", can improve controllability of the channel by the gate. According to this structure, controllability of potentials in the lower part of the semiconductor raised portion can be improved by a gate electrode area below the lower end of the semiconductor raised portion, the steepness (subthreshold characteristic) of on/off transition is improved, and off current can be inhibited. Similarly, FIG. 24(b) shows a π gate structure.

FIG. 23(c) shows a structure in which the gate electrode 504 partially turns around to the lower face side of the semiconductor raised portion 503. This structure is called an "Ω gate structure" because it has a shape similar to a Greek letter "Ω". According to this structure, controllability of the channel by the gate is improved, and the lower face of the semiconductor raised portion can also be used as a channel, thus making it possible to improve a drive capability. Similarly, FIG. 24(c) shows an Ω gate structure.

FIG. 23(d) shows a structure in which the gate electrode 504 fully turns around to the lower face side of the semiconductor raised portion 503. This structure, in which the semiconductor raised portion floats at the area below the gate from the substrate plane, is called a "gate all around (GM) structure". According to this structure, the drive capability can be improved because the lower face of the semiconductor raised portion can also be used as a channel, and moreover, the short channel characteristic can be improved. Similarly, FIG. 24(d) shows a GM gate structure.

The semiconductor raised portion may have the same sectional shape at the area below the gate electrode and at the area below a buried conductor interconnect according to the present invention, or may have different sectional shapes at these areas as will be described later.

For source and drain regions of the Fin type MISFET in the present invention, diffusion layers with high-concentration impurities introduced in areas of the semiconductor raised portion 303 on opposite sides of the gate electrode may be source and drain regions 306 as shown in FIGS. 3(a) to 3(d). The source and drain regions 306 may be fully metallized to realize a Schottky source/drain structure.

The Fin type MISFET in the present invention may have so called a multiple Fin structure in which one transistor has therein a plurality of semiconductor raised portions arranged, for example parallel to each other in a single line, and the gate electrode is formed of conductor interconnect provided over the plurality of semiconductor raised portions. The element structure associated with each semiconductor raised portion may be a structure similar to the aforementioned structure. It is preferable that the semiconductor raised portions belonging to one transistor all have an equal width W (width in a direction parallel to the substrate plane and vertical to the channel length direction), and arranged regularly in parallel to each other, to achieve uniformity of element characteristic and ease of manufacturing.

Such a multiple Fin structure has a plurality of semiconductor raised portions using its height, the size of its side faces vertical to the substrate plane, as the channel width, and therefore allows the area necessary per channel width to be reduced, and is advantageous for reduction in size of the element. This multiple Fin structure allows the channel width to be controlled by changing the number of semiconductor raised portions, whereby it becomes unnecessary to change the height of the elements to integrate different channel width on a single chip, and the level of irregularities of the element can be reduced to secure the uniformity of element characteristics.

In the Fin type MISFET in the present invention, main channels are preferably formed on the opposite side faces of the semiconductor raised portion, and the width of the semiconductor raised portion at the area below the gate electrode is preferably a width that is fully depleted by depletion layers formed from the opposite side faces of the semiconductor raised portion during operation. Such a configuration is advantageous for improvement of the cutoff characteristic and carrier mobility and reduction of the substrate floatation effect. For the element structure with which this configuration can be obtained, the width W of the semiconductor raised portion at the area below the gate electrode is preferably equal to or less than twice as large as the height H of the semiconductor raised portion, or equal to or less than the gate length L. Specifically, the width of the semiconductor raised portion at the area below the gate electrode is set to preferably 5 nm or greater, more preferably 10 nm or greater in terms of accuracy of processing, strength and the like, and set to preferably 60 nm or less, more preferably 30 nm or less in terms of obtainment of a structure in which channels formed on the side faces of the semiconductor raised portion are dominant channels and which is of full depletion type.

The specific dimensions and the like of the MISFET having the semiconductor raised portion may appropriately be set within the following range, for example.

Width W of semiconductor raised portion: 5 to 100 nm;
Height H of semiconductor raised portion: 20 to 200 nm;
Gate length L: 10 to 100 nm;
Thickness of gate insulating film: 1 to 5 nm (for $SiO_2$);
Concentration of impurities in channel formation region: 0 to $1 \times 10^{19}$ $cm^{-3}$; and
Concentration of impurities in source/drain region: $1 \times 10^{19}$ to $1 \times 10^{21}$ $cm^{-3}$.

The height H of the semiconductor raised portion refers to the length of a semiconductor area protruding from the flat surface of the base insulating film in a direction vertical to the substrate flat surface. The channel formation region refers to an area of the semiconductor raised portion under the gate electrode.

The present invention relates to a semiconductor device comprising the Fin type MISFET described above, and has a characteristic configuration that will be described below.

The semiconductor device of the present invention has an interlayer insulating film that is provided on a substrate so as to bury the Fin type MISFET, and a buried conductor interconnect that is formed by filling in a trench formed in the interlayer insulating film with a conductor. The buried conductor interconnect connects one of the source and drain regions of the semiconductor raised portion of the Fin type MISFET to another conductive portion below the interlayer insulating film.

One embodiment of the aforementioned configuration is shown in FIGS. 4(a) to 4(e). This configuration is an example where the semiconductor device comprises a Fin type MISFET having so called a multiple Fin structure in which one Fin type MISFET has a plurality of semiconductor raised portions, and a gate electrode formed of a conductor provided over the plurality of semiconductor raised portions. FIG. 4(a) shows a plan view, FIG. 4(b) shows a cross-sectional view taken along the A-A' line, FIG. 4(c) shows a cross-sectional view taken along the B-B' line, FIG. 4(d) shows a cross-sectional view taken along the C-C' line, and FIG. 4(e) shows a cross-sectional view taken along the D-D' line. In the figures, reference numeral 402 denotes a base insulating film, reference numeral 403 denotes a semiconductor raised portion, reference numeral 404 denotes a gate electrode, reference numeral 405 denotes a gate insulating film, reference numeral 406 denotes source and drain regions, reference numeral 407 denotes a channel formation region, reference numeral 408 denotes a cap insulating film, reference numeral 410 denotes a first interlayer insulating film, reference numeral 411 denotes a buried conductor interconnect, reference numeral 420 denotes a second interlayer insulating film, reference numeral 421 denotes a plug, and reference numeral 422 denotes an upper interconnect. Connection between the gate electrode 404 and the upper interconnect is not shown in the figures, but for example, the gate electrode 404 can be connected to the upper interconnect through the plug in a region that is not shown in the figures. At this time, a buried conductor interconnect that is formed concurrently with formation of the buried conductor interconnect 411 may appropriately exist between the plug and the gate electrode.

In the embodiment shown in FIGS. 4(a) to 4(e), a Fin type MISFET having a multiple Fin structure that comprises two semiconductor raised portions 403 on the base insulating film 402 is formed, and the Fin type MISFET is buried by the first interlayer insulating film 410. The first interlayer insulating film 410 is provided with the buried conductor interconnect 411 formed by filling in a trench formed in the first interlayer insulating film 410 with a conductor, and source/drain regions of two semiconductor raised portions 403 are mutually coupled by the buried conductor interconnect 411. Further, the buried conductor interconnect 411 is connected to the upper interconnect 422 through the plug 421 provided in the second interlayer insulating film 420. The buried conductor interconnect and the upper interconnect may be connected directly as shown in FIGS. 5(a) to 5(d). FIG. 5(a) shows a plan view, FIG. 5(b) shows a cross-sectional view taken along the A-A' line, FIG. 5(c) shows a cross-sectional view taken along the B-B' line, FIG. 5(d) shows a cross-sectional view taken along the C-C' line, and symbols in these figures correspond to the symbols in FIGS. 4(a) to 4(e).

By providing the buried conductor interconnect and the semiconductor raised portion such that on the substrate plane, their centerlines in the longitudinal direction cross each other, preferably orthogonally cross each other, the buried conductor interconnect and the semiconductor raised portion can be connected in a self-aligned manner against misalignment with the longitudinal direction of the buried conductor interconnect. As a result, connection failures resulting from misregistration are hard to occur, and the reliability and yield of the element can be improved. When the trench provided in the interlayer insulating film for forming the buried conductor interconnect has a linear opening, formation of a fine opening pattern is facilitated. The linear opening pattern is easily formed, allows a conductor to be buried easily compared to a rectangular opening, and is thus advantageous in terms of production. As a result, failures of formation of the opening pattern and failures of filling with the conductor are hard to occur, thus making it possible to improve the reliability and yield of the element.

Conventionally, two conductors: a contact conductor filled in a contact hole and a interconnect conductor for connecting the contact conductors are provided (e.g. reference numerals 228 and 229 in FIG. 2) when conductors are electrically connected in a semiconductor device. According to the present invention, the semiconductor raised portion and any other conductive portion (in FIG. 4, another semiconductor raised portion) can be connected by one buried conductor interconnect which can be formed at a time. Consequently, the number of processing steps is reduced, and the reliability and yield can be improved.

In the present invention, connection by the buried conductor interconnect takes advantage of the structure in which the semiconductor raised portion to be connected protrudes from the substrate plane, or still another conductive portion protrudes from the substrate plane, and by situating the lower face of the buried conductor interconnect at a level lower than that of the uppermost face of the semiconductor raised portion or the uppermost face of still another conductive portion, satisfactory connection can be established.

In the present invention, a plurality of buried conductor interconnects can be provided, but their top faces are preferably almost coplanar in facilitating production steps. For example, in-plane uniformity in a step of forming a contact with the buried conductor interconnect such as a photoresist step and an etching step is easily secured. By filling in a trench formed in a interlayer insulating film with a conductor and removing the conductor outside of the trench by a chemical-mechanical polishing (CMP) method to form an buried conductor interconnect, the height of the top faces of a plurality of buried conductor interconnects can be equalized. According to the CMP step, the heights of the top face of the buried conductor interconnect and the top face of the interlayer insulating film can be equalized. Consequently, the CMP step for flattening the interlayer insulating film after depositing an interlayer insulating film on the aforementioned interlayer insulating film can be omitted, thus making it possible to simplify production steps.

The buried conductor interconnect in the present invention is preferably in contact with the opposite side faces of the semiconductor raised portion 403 at an area of connection with the source/drain region 406 of the semiconductor raised portion 403 as shown in FIGS. 4(a) to 4(e) and FIGS. 5(a) to 5(d). Consequently, the area of contact between the buried conductor interconnect and the semiconductor raised portion increases, and thus the contact resistance can be reduced. In the present invention, the top face and opposite side faces of the semiconductor raised portion 403 are preferably in contact with the buried conductor interconnect 411 as shown FIGS. 4(a) to 4(e) and FIGS. 5(a) to 5(d), but if a sufficient contact area is secured in the opposite side faces, the buried conductor interconnect 411 may be formed without removing the cap insulating film 408 on the semiconductor raised portion 403 so that the buried conductor interconnect 411 is not in contact with the top face of the semiconductor raised portion 403 as shown in FIGS. 6(a) and 6(b). FIG. 6(a) shows a cross-sectional view taken along the B-B' line of FIG. 4(a), FIG. 6(b) shows a cross-sectional view taken along the C-C' line, and the symbols in these figures correspond to the symbols in FIGS. 4(a) to 4(e).

If a sufficient contact area is secured at an area of connection between the buried conductor interconnect 411 and the source/drain region 406 of the semiconductor raised portion 403 in the present invention, the buried conductor interconnect 411 and the source/drain region 406 may be in partial contact in which contact areas on the opposite side faces of the semiconductor raised portion do not reach the lower ends of the side faces of the semiconductor raised portion (i.e. the buried conductor interconnect 411 does not reach the base insulating film 402) as shown in FIGS. 4(a) to 4(e), FIGS. 5(a) to 5(d) and FIGS. 6(a) and 6(b).

For the area of connection between the buried conductor interconnect 411 and the source/drain region 406 of the semiconductor raised portion 403 in the present invention, the buried conductor interconnect 411 and the source/drain region 406 may be in contact with each other over an area ranging from the upper end of the side face of the semiconductor raised portion to the lower end (throughout the source/drain region 406 in a direction vertical to the substrate) as shown in FIGS. 7(a) and 7(b). FIGS. 7(a) and 7(b) show a cross-sectional view taken along the B-B' line of FIG. 4(a), and symbols in these figures correspond to the symbols in FIGS. 4(a) to 4(e). In this case, the buried conductor interconnect 411 reaches the base insulating film 402, and further extends to a position deeper than the lower end of the semiconductor raised portion 403 (a position lower than the flat surface of the base insulating film 402). As shown in FIG.

7(a), the insulating film below the semiconductor raised portion 403 may be removed, and a conductor buried in place of the removed insulating film, so that the lower face of the semiconductor raised portion 403 is also in contact with the buried conductor interconnect 411.

The buried conductor interconnect 411 in the present invention may be in contact with the end face of the semiconductor raised portion 403 in the longitudinal direction (channel length direction) as shown in FIGS. 8(a) and 8(b). Consequently, the resistance of contact between the buried conductor interconnect and the semiconductor raised portion can further be reduced.

In the structures described above and shown in FIGS. 4(a) to 4(e), 5(a) to 5(d), 6(a) and 6(d), 7(a) and 7(b) and 8(a) and 8(b), the semiconductor raised portion 403 is provided on the base insulating film 402, but the present invention may employ a configuration in which the semiconductor raised portion 403 is a part of the semiconductor substrate 401 below the base insulating film 402 as shown in FIGS. 9(a) and 9(b). FIG. 9(a) shows a cross-sectional view take along the B-B' line, FIG. 9(b) shows a cross-sectional view taken along the C-C' line, and symbols in these figures correspond to the symbols in FIGS. 4(a) to 4(e). In the structure shown in FIGS. 9(a) and 9(b), the upper face of the semiconductor raised portion under the gate electrode is provided with the gate insulating film 405 in place of the cap insulating film, and the insulating film on the upper face of the semiconductor raised portion other than the area below the gate electrode is removed. A selection may appropriately be made on presence or absence of the cap insulating film irrespective of whether the semiconductor raised portion is situated on the base insulating film or is a part of the semiconductor substrate.

In the structures shown in FIGS. 4(a) to 4(e), 5(a) to 5(d), 6(a) and 6(d), 7(a) and 7(b) and 8(a) and 8(b), a plurality of linear semiconductor raised portions are provided, but as shown in FIG. 10 (plan view), the ends of at least one side (both sides in FIG. 10) of adjacent semiconductor raised portions 403 in the channel length direction may be combined integrally. For ensuring the uniformity of width W of the semiconductor raised portion, there is preferably a sufficient distance d between the gate electrode 404 and the combining portion between the ends of the semiconductor raised portions. Preferably, at least the entire upper face of this combining portion is connected to the buried conductor interconnect 411, and more preferably, the opposite side faces are connected as shown in FIG. 10. By providing such an area of connection, the area of contact with the buried conductor interconnect can be increased, and in addition, collapse of the semiconductor raised portion that tends to occur when the semiconductor raised portion has a great height can be prevented. The combining portion is situated in a region of formation of the buried conductor interconnect, and therefore it is not necessary to increase the size of the combining portion like a conventional connecting pad, thus making it possible to ensure sufficient densification. Even when there is a sufficient distance d, an increase in resistance can be prevented if the buried conductor interconnect is connected to the semiconductor raised portion at an area close to the gate electrode.

The buried conductor interconnect in the present invention may be formed from various kinds of conductors. It is preferable to form a configuration where a conductive metal such as W or a metallic compound is filled in a trench on contact with a base conductive film having barrier capability and adhesion. The buried conductor interconnect may have a configuration in which the conductor is composed of a single metal or metallic compound, which itself is the base film. Examples of the base film may include a Ti film, a TiN film, a Ta film, a TaN film, a WN film and layered films selected from two or more of these films.

In the present invention, an area of connection between the buried conductor interconnect and the source/drain region of the semiconductor raised portion may have a resistance lowering layer which exists therebetween. Consequently, the resistance of contact between the buried conductor interconnect and the semiconductor raised portion can be reduced. The resistance lowering layer may be provided so as to cover the entire source/drain region of the semiconductor raised portion, or may be provided selectively at the area of connection between the semiconductor raised portion and the buried conductor interconnect. The resistance lowering layer may be formed with a metal such as Ti or W, or a silicide compound of at least one metal selected from Ti, Co, Ni, Pt, Pd, Mo, W, Zr, Hf, Ta, Ir, Al, V, Cr and the like.

The semiconductor raised portion in the present invention may have a shape of rectangular parallelepiped, but may have a configuration in which its width W (width in a direction parallel to the substrate flat surface and vertical to the channel length direction) is wider than the width W of the area below the gate electrode at the area of connection between the source/drain region of the semiconductor raised portion and the buried conductor interconnect as shown in, for example, FIGS. 22(a1) and 22(a2), 22(b1) and 22(b2), 22(c1) and 22(c2), and 22(d1) and 22(d2) described later. The area having a wider width W is preferably provided at least at the upper end of the source/drain region of the semiconductor raised portion, whereby the area of contact at the area of connection increases, and thus the contact resistance can be reduced. The wider area may be provided throughout the channel length direction of the source/drain region at the upper end of the semiconductor raised portion, or may be provided selectively at the area of connection between the semiconductor raised portion and the buried conductor interconnect.

The embodiments described above each have a structure in which one Fin type MISFET has a plurality of semiconductor raised portions, and the source/drain regions of the semiconductor raised portions are coupled by the buried conductor interconnect. The present invention may also employ a structure in which the source/drain region of the semiconductor raised portion of one Fin type MISFET and the gate electrode or the source/drain region of another MISFET are connected by the buried conductor interconnect.

FIGS. 11(a) and 11(b) shows a structure in which the source/drain region 406 of a semiconductor raised portion 403a of one Fin type MISFET and a gate electrode 404b of another Fin type MISFET are connected by a buried conductor interconnect 411c. FIG. 11(a) is a plan view, and FIG. 11(b) is a cross-sectional view taken along the line A-A'. Symbols 403a and 403b in the figure denote semiconductor raised portions, symbols 404a and 404b denote conductor wirings forming the gate electrode, symbol 405b denotes a gate insulating film, symbols 411a, 411b and 411c denote conductor interconnects, and other symbols correspond to those in FIGS. 4(a) to 4(e). According to this configuration, the source/drain region and the gate electrode can be connected densely between different MISFETS.

FIGS. 12(a) and 12(b) show a structure in which the source/drain region of the semiconductor raised portion 403a of one Fin type MISFET and the source/drain region of the semiconductor raised portion 403b of another Fin type MISFET are connected by the buried conductor interconnect 411c. FIG. 12(a) is a plan view, and FIG. 12(b) is a circuit diagram. In the figures, symbols 403a and 403b denote semiconductor raised portions, symbol 404 denotes a conductor forming a gate electrode, symbols 411a, 411b and 411c denote buried conductor interconnects, and the black circle denotes a plug.

The embodiment shown in FIG. 12 is an example of a CMOS inverter comprising a pMOS that has two semiconductor raised portions 403a and an nMOS that has one semiconductor raised portion 403b. Gate electrodes of the pMOS and the nMOS is formed of a common conductor 404, and a plug leading to an input portion is connected to the conductor 404. The drain region of the PMOS and the drain region of the nMOS are connected by the buried conductor interconnect 411c, and a plug leading to an output portion is connected to the buried conductor interconnect 411c. The buried conductor interconnect 411c also provides connection between drain regions provided in two semiconductor raised portions 403a of the pMOS. Source regions provided in two semiconductor raised portions of the pMOS are connected by the buried conductor interconnect 411a, and a plug leading to a power supply Vdd is connected to the buried conductor interconnect 411a. A source region of the semiconductor raised portion 403b of the nMOS is connected to the buried conductor interconnect 411b, and a plug leading to a ground GND is connected to the buried conductor interconnect 411b.

FIGS. 13(a) and 13(b) and 14(a) to 14(c) show a structure in which a source/drain region of a semiconductor raised portion of a first Fin type MISFET, a source/drain region of a second Fin type MISFET, and a gate electrode of a third Fin type MISFET are connected by a buried conductor interconnect. FIG. 13(a) is a circuit diagram, FIG. 13(b) is a plan view, FIG. 14(a) is a cross-sectional view taken along the A-A' line, FIG. 14(b) is a cross-sectional view taken along the B-B' line, and FIG. 14(c) is a cross-sectional view taken along the C-C' line. In the figures, symbols 403a, 403b, 403c and 403d denote semiconductor raised portions, symbols 404a, 404b, 404c and 404d denote conductors forming a gate electrode, symbols 411L1, 411L2, 411a1, 411a2, 411b, 411c, 411d1 and 411d2 denote buried conductor interconnects, and other symbols correspond to those in FIGS. 4(a) to 4(e). Black circular portions indicate plugs.

This embodiment is an example of a SRAM (Static Random Access Memory) comprising a pair of drive transistors Td1 and Td2, a pair of load transistors Tp1 and Tp2 and a pair of transfer transistors Tt1 and Tt2 consisting of Fin type MISFETs, in which a memory cell is composed of a flip flop circuit comprising the pair of drive transistors and the pair of load transistors, and the pair of transfer transistors. The pair of drive transistors Td1 and Td2 and the pair of transfer transistors Tt1 and Tt2 are of n channel type, and the pair of load transistors Tp1 and Tp2 are of p Channel type.

As shown in FIG. 13(a), the aforementioned flip flop circuit consists of a pair of CMOS inverters, and each CMOS inverter consists of one drive transistor and one load transistor. The gate of the drive transistor Td1 and the load transistor Tp1 of one CMOS inverter is connected to the drain (storage node N2) of the drive transistor Td2 and the load transistor Tp2 of the other CMOS inverter. The gate of the drive transistor Td2 and the load transistor Tp2 of the latter CMOS inverter is connected to the drain (storage node N1) of the drive transistor Td1 and the load transistor Tp1 of the former CMOS inverter. Thus, the input and output node of a pair of CMOS inverters are cross-coupled to each other through a pair of interconnects L1 and L2 called local interconnects.

In this embodiment, gate electrodes of the first drive transistor Td1 and the first load transistor Tp1 is formed of a common first conductor 404b, and gate electrodes of the second drive transistor Td2 and the second load transistor Tp2 is formed of a common second conductor 404c as shown in FIG. 13(b). The first drive transistor Td1 and the first transfer transistor Tt1 have a common first semiconductor raised portion 403a, and the second drive transistor Td2 and the second transfer transistor Tt2 have a common second semiconductor raised portion 403d. The first conductor 404b, the drain region provided in the third semiconductor raised portion 403c of the second load transistor Tp2, and the source/drain region common in the second drive transistor Td2 and the second transfer transistor Tt2 provided in the second semiconductor raised portion 403d are connected by the buried conductor interconnect 411L2 forming one of a pair of local interconnects, and the second conductor 404c, the drain region provided in the fourth semiconductor raised portion 403b of the first load transistor Tp1, and the source/drain region common in the first drive transistor Td1 and the first transfer transistor Tt1 provided in the first semiconductor raised portion 403a are connected by the buried conductor interconnect 411L1 forming the other local interconnect. That is, a pair of local interconnects L1 and L2 cross-coupling a pair of input/output terminals of the aforementioned flip flop circuit consists of the buried conductor interconnects 411L1 and 411L2, respectively.

In this embodiment, the buried conductor interconnects 411a1 and 411d1 are connected to the other source/drain regions of the transfer transistors Tt1 and Tt2, respectively, and plugs leading to a bit line BL are connected to these buried conductor interconnects 411a1 and 411d1, respectively. Plugs leading to a word line WL are connected, respectively, to the conductors 404a and 404d forming the gate electrodes of the transfer transistors Tt1 and Tt2. The buried conductor interconnects 411b and 411c are connected to the source regions of the first and second load transistors Tp1 and Tp2, respectively, plugs leading to the power supply VDD are connected to these buried conductor interconnects 411b and 411c, respectively. The buried conductor interconnects 411a2 and 411d2 are connected to the source regions of the first and second drive transistors Td1 and Td2, respectively, and plugs leading to the ground GND are connected to these buried conductor interconnects 411a2 and 411d2.

According to such a configuration, dense interconnecting is possible, and local interconnects can be formed without carrying out additional processing steps. If semiconductor raised portions of a plurality of Fin type MISFETs, respectively, are arranged mutually in parallel, the semiconductor raised portions may be patterned in the form of line and space, and therefore even a semiconductor raised portion having a narrow width W can be formed easily and accurately.

The present invention may also be applied when the Fin type MISFET is formed on a substrate on which a planer type MISFET is provided. Further, the buried conductor interconnect according to the present invention may be used for electric connection between the Fin type MISFET and the planer type MISFET. One example is shown in FIGS. 25(a) to 25(c). FIGS. 25(a) to 25(c) show structures at cross-sectional positions corresponding to those in FIGS. 4(a) to 4(c), respectively.

In the example of FIGS. 25(a) to 25(c), a wide semiconductor raised portion 403p is formed in place of one of the semiconductor raised portions 403 of the Fin type MISFET shown in FIGS. 4(a) to 4(e). The wide semiconductor raised portion 403p has a main channel formed on its top face, and is used for a planer type MISFET. This planer type MISFET may be used suitably for an input/output portion and an analog portion of an integrated circuit. In this example, the cap insulating film 408 is not provided for facilitating formation of the planer type MISFET. A gate electrode 404p of the planer type MISFET is provided separately from the gate electrode 404 of the Fin type MISFET.

In the example of FIGS. 25(a) to 25(c), the buried conductor interconnect 411 is connected to one of the source and drain of the semiconductor raised portions of the Fin type MISFET and one of the source and drain of the wide semiconductor raised portions 403p of the planer type MISFET. When the buried conductor interconnect that is used in the Fin type MISFET is thus applied to the planer type MISFET, a structure and a process can be made common between the Fin type MISFET and the planer type MISFET, thus making it possible to densify and reduce the cost of an integrated circuit in which the Fin type MISFET and the planer type MISFET coexist.

The example of FIGS. 25(a) to 25(c) show a structure in which a SOI substrate is used and the semiconductor raised portion 403 formed of a semiconductor layer on the base insulating film, but the present invention may also be applied to a structure in which a bulk substrate is used and the semiconductor raised portion is formed of a part of the substrate.

In the element structure described above, the material of the base insulating film is not specifically limited as long as it has a desired insulation characteristic, and such materials may include, for example, $SiO_2$, $Si_3N_4$, AlN, metal oxides such as alumina, and organic insulating materials. As a semiconductor for forming the semiconductor raised portion, monocrystalline silicon may suitably be used.

In the present invention, a silicon substrate may suitably be used as a substrate below the base insulating film, but the present invention can be constructed as long as the insulating film exists below the semiconductor raised portion except for a case where the semiconductor raised portion is formed of a part of the semiconductor substrate below the base insulating film. For example, there may be a structure in which the insulating film below the semiconductor layer is a support substrate as in SOS (silicon on sapphire or silicon on spinel). Insulating support substrates include quartz and AlN substrates in addition to the aforementioned SOS substrate. The semiconductor layer can be provided on these support substrates by a technique for producing SOI (lamination step and thin film forming step).

As a material of the gate electrode in the present invention, a conductor having a desired conductivity and work function may be used, and such materials include, for example, impurity-containing semiconductors such as polycrystalline silicon, polycrystalline SiGe, polycrystalline Ge and polycrystalline SiC containing impurities, metals such as Mo, W, Ta, Ti, Hf, Re and Ru, metal nitrides such as TiN, TaN, HfN and WN, and silicide compounds such as cobalt silicide, nickel silicide, platinum silicide and erbium silicide. As a structure of the gate electrode, a layered structure such as a layered film of a semiconductor and a metal film, a layered film of metal films or a layered film of a semiconductor and a silicide film, as well as a single-layered film, may be used.

As a gate insulating film in the present invention, a $SiO_2$ film or SiON film may be used, and a high dielectric insulating film (High-K film) may be used as well. High-K films may include, for example, metal oxide films such as $Ta_2O_5$ film, $Al_2O_3$ film, $La_2O_3$ film, $HfO_2$ film and $ZrO_2$ film, and compound metal oxides expressed by compositions of HfSiO, ZrSiO, HfAlO, ZrAlO and the like. The gate insulating film may have a layered structure, and may be, for example, a layered film made by forming a silicon-containing oxide film such as $SiO_2$ or HfSiO on a semiconductor layer of silicon or the like and providing a High-K film thereon.

A method for producing the semiconductor device of the present invention will be described below with examples.

First, a SOI substrate having on a silicon substrate a buried insulating film (base insulating film) made of $SiO_2$ and having thereon a semiconductor layer made of monocrystalline silicon is prepared. A sacrificial oxide film is formed on the semiconductor layer of the SOI substrate, and impurities for channel formation region are ion-implanted through the sacrificial oxide film. Then, the sacrificial oxide film is removed, and an insulating film for forming a cap insulating film is then formed on the semiconductor layer. The aforementioned ion implantation and formation and removal of the sacrificial oxide film may be omitted as appropriate.

Next, by photolithography and dry etching, the semiconductor layer and the insulating film formed thereon are patterned to form a semiconductor raised portion. Then, a gate insulating film is formed on the surface (side faces) of the semiconductor raised portion.

If the cap insulating film is not necessary on the top face of the semiconductor raised portion, the aforementioned insulating film may be removed before applying photolithography. Rather than continuously patterning the aforementioned insulating film and semiconductor layer, the aforementioned insulating film may first be patterned, and a resist mask may be removed, followed by patterning the aforementioned semiconductor layer using the aforementioned patterned insulating film as a mask (hard mask).

After forming the semiconductor raised portion and before forming the gate insulating film, the base insulating film may be etched anisotropically (downward) to form a π gate structure, and etched isotropically (downward and laterally) to form an Ω gate structure or a GAA gate structure.

Next, a polycrystalline silicon film is formed on the entire surface, and patterned to form a pattern for a gate electrode. Then, impurities are ion-plated in a slanting direction with respect to the substrate flat surface to impart conductivity to this gate pattern and form source and drain regions on the semiconductor raised portion. The configuration at this time is shown in FIGS. 15(a), (b), (c) and (d). FIG. 15(a) is a plane view, FIG. 15(b) is a cross-sectional view taken along the A-A' line, FIG. 15(c) is a cross-sectional view taken along the B-B' line, FIG. 15(d) is a cross-sectional view taken along the C-C' line, and symbols in these figures correspond to the symbols in FIGS. 4(a) to 4(e).

Next, an interlayer insulating film 410 is formed on the entire surface, and the surface is polished by a chemical mechanical polishing (CMP) method to flatten the surface.

Next, by photolithography and dry etching, a trench 430 is formed such that a conductive portion (semiconductor raised portion) to be coupled is exposed. At this time, the cap insulating film 408 in the trench is also removed to expose the surface of the semiconductor raised portion 403.

The configuration at this time is shown in FIGS. 16(a), 16(b), 16(c) and 16(d). FIG. 16(a) is a plane view, FIG. 16(b) is a cross-sectional view taken along the A-A' line, FIG. 16(c) is a cross-sectional view taken along the B-B' line, FIG. 16(d) is a cross-sectional view taken along the C-C' line, and symbols in these Figures correspond to the symbols in FIGS. 4(a) to 4(e).

Next, a base conductive film 431 is formed on the entire surface by CVD (Chemical Vapor Deposition), PVD (Physical Vapor Deposition) or the like so as to cover the inside of the trench 430, and the conductor is then deposited by CVD or the like so as to fill in the trench. The base film and the conductor film other than a part of these films inside the trench are removed by the CMP method to flatten the surface, and a buried conductor interconnect 411 is formed. The configuration at this time is shown in FIGS. 17(a) and 17(b). FIG. 17(a) is a cross-sectional view taken along the B-B' line, FIG.

17(b) is a cross-sectional view taken along the C-C' line, and symbols in these figures correspond to the symbols in FIGS. 16(a) to 16(c). The base film 431 and the semiconductor raised portion 403 may be made to undergo a silicide formation reaction to lower the contact resistance. If the silicide formation reaction is carried out, an unreacted area (semiconductor such as monocrystalline silicon) is preferably left on the core of the semiconductor raised portion in terms of conductivity in the channel length direction in the semiconductor raised portion.

Next, by a known method, an upper interconnect 422 that is coupled to the buried conductor interconnect 411 through a plug or directly can be provided as shown in FIGS. 4(a) to 4(e) or FIGS. 5(a) to 5(d). The plug may be formed using W or Cu, and the upper interconnect may be formed using Cu or Al.

The structure shown in FIG. 7(b) can be obtained by performing dry etching until engraving the base insulating film 402 in the step of forming the trench 430 described above, and filling in the trench with a conductor. The structure shown in FIG. 7(a) can be formed by performing anisotropic dry etching until engraving the base insulating film 402 to form a trench, then performing isotropic dry etching or wet etching, further removing the insulating film in the lower part of the semiconductor raised portion in the trench, and filling in the trench with a conductor so as to bury the conductor in an area where the insulating film has been removed.

By adding the following steps in the process described above, a side wall can be provided on the side face of the gate electrode.

After the pattern for a gate electrode is formed, an insulating film for forming a side wall is provided on the entire surface in a thickness allowing the gate electrode to be buried, and the surface is flatten by the CMP method. Then, a resist pattern having a width wider than the width of the pattern for a gate electrode in the gate length direction is provided on the insulating film such that the resist pattern is superimposed on the gate pattern, and the insulating film is selectively removed using the resist pattern as a mask. At this time, the cap insulating film on the semiconductor raised portion is also selectively removed. Consequently, a side wall 440 consisting of the insulating film can be provided on the side face of the conductor pattern 404 for a gate electrode as shown in FIGS. 18(a) to 18(c). FIG. 18(a) is a plan view, FIG. 18(b) is a cross-sectional view taken along the B-B' line, FIG. 18(c) is a cross-sectional view taken along the C-C' line, and symbols in these figures correspond the symbols in FIGS. 4(a) to 4(e). Ion implantation of impurities may be carried out before and after the step of forming the side wall, and in this case, a relatively low-concentration impurity diffusion layer can be provided below the side wall, and so called an LDD (Lightly doped drain) structure can be formed.

The side wall can also be formed by the following method. After the pattern for forming a gate electrode is formed, an insulating film for forming a side wall is lightly provided on both top faces and side faces of recessed and raised portions such that the insulating film is deposited in an equal thickness, and the insulating film is cut back (etched back) only in an up-and-down direction by anisotropic etching. The method for forming a side wall is similar to a method that is used for production of a planer type MISFET, but in this method, the side wall may be formed on the side face of the semiconductor raised portion. For preventing this, it is desirable that after making the gate electrode have a sufficiently large thickness, the insulating film should sufficiently etched back so that no side wall is left on the side face of the semiconductor raised portion.

Further, after the side wall is formed and ion implantation of impurities are carried out in a manner described above, a resistance lowering layer may be formed on the surface of the semiconductor raised portion. The structure at the time of providing a resistance lowering layer 450 is provided on the surface of the semiconductor raised portion subsequent to the step shown in FIGS. 18(a) to 18(b) is shown in FIGS. 19(a) to 19(c). FIG. 19(a) is a plan view, FIG. 19(b) is a cross-sectional view taken along the B-B' line, FIG. 19(c) is a cross-sectional view taken along the C-C' line, and symbols in these figures correspond to the symbols in FIGS. 18(a) to 18(c).

Owing to formation of the resistance lowering layer, the width W of the semiconductor raised portion (including resistance lowering layer) becomes wider to increase the contact area, and thus the resistance of contact between the semiconductor raised portion and the buried conductor interconnect can be reduced along with the conductivity of the resistance lowering layer. Further, the conductivity of the semiconductor raised portion in the channel length direction can be increased. In addition, the resistance lowering layer may be used as an etching stopper in a step of formation of the trench 430 that is carried out later. The resistance lowering layer can be formed by selectively growing a metal or metallic compound such as NiSi, $CoSi_2$, $TiSi_2$, Ni, Co, Ti or W on the exposed area of the semiconductor raised portion by the CVD method or the like. The metal thus grown may be made to undergo a silicide formation reaction with silicon of the semiconductor raised portion to reduce the contact resistance. Alternatively, the resistance lowering layer can be formed by unselectively growing Ni, Co, Ti or the like by the PVD method, the CVD method or the like, and then reacting the metal so as to form a salicide (making the metal undergo a silicide formation reaction with silicon of the semiconductor raised portion in a self-aligned manner, and then removing only unreacted metal). When the silicide formation described above is carried out, an unreacted area (monocrystalline silicon) is preferably left on the core of the semiconductor raised portion in terms of conductivity in the channel length direction in the semiconductor raised portion. Alternatively, the unreacted area may intentionally be eliminated to form a Schottky source/drain.

After the aforementioned resistance lowering layer 450 is formed, the interlayer insulating film 410 is formed on the entire surface, and the surface is flattened by the CMP method. Then, the trench 430 is formed by photolithography and dry etching such that a conductive portion (semiconductor raised portion 403) to be coupled is exposed. The configuration at this time is shown in FIGS. 20(a) to 20(d). FIG. 20(a) is a plan view, FIG. 20(b) is a cross-sectional view taken along the A-A' line, FIG. 20(c) is a cross-sectional view taken along the B-B' line, FIG. 20(d) is a cross-sectional view taken along the C-C' line, and symbols in these figures correspond to the symbols in FIGS. 19(a) to 19(c). Next, a base conductive film 431 is deposited in the trench 430; and then the trench is further filled with a conductor to form a buried conductor interconnect 411 as shown in FIGS. 21(a) to 21(c). FIG. 21(a) is a plan view, FIG. 21(b) is a cross-sectional view taken along the B-B' line, FIG. 21(c) is a cross-sectional view taken along the C-C' line, and symbols in these figures correspond to the symbols in FIGS. 20(a) to 20(d). Alternatively, the resistance lowering layer 450 may be provided on the surface of the semiconductor raised portion exposed in the trench after forming the trench 430. Next, by a known method, the upper interconnect 422 which is coupled to the buried conductor interconnect 411 through a plug or directly can be provided as shown in FIG. 4(a) to 4(e) or FIGS. 5(a) to 5(d).

In the process described above, Si can be grown epitaxially on the surface of the semiconductor raised portion to provide a grown silicon layer 460 as shown in FIGS. 22(a1) and 22(a2), 22(b1) and 22(b2), 22(c1) and 22(c2), and 22(d1) and 22(d2) before forming the resistance lowering layer 450. FIGS. 22(a1), 22(b1), 22(c1) and 22(d1) are cross-sectional views taken along the B-B' line in FIG. 18(a), FIGS. 22(a2), 22(b2), 22(c2) and 22(d2) are cross-sectional views taken along the C-C' line in FIG. 18(a), and symbols in these figures correspond to the symbols 18(a) to 18(c). By providing the grown silicon layer 460, the width W of the semiconductor raised portion is widen to increase the contact area, thus making it possible to reduce the resistance of contact between the semiconductor raised portion and the buried conductor interconnect. The grown silicon layer 460 may be provided on the entire surface of the exposed semiconductor raised portion, but may be formed so as to widen the width of the semiconductor raised portion at the upper end, and may be provided over at least an area ranging from the top face to each part of the opposite side faces as shown in FIG. 22(a1), for example. Impurities are preferably ion-implanted into the grown silicon layer 460 for the conductivity as shown in FIGS. 22(b1) and 22(b2). Next, the resistance lowering layer 450 is provided at least on the top face of the semiconductor raised portions. If the width W of the semiconductor raised portion is sufficiently widened by the grown silicon layer 460, for example, as shown in FIGS. 22(c1) and 22(c2), a sufficient contact resistance reduction effect can be obtained merely by providing the resistance lowering layer 450 only on the top face of the semiconductor raised portion. In this case, the resistance lowering layer 450 can easily be formed by depositing a metal such as Ni, Co or Ti on the top face of the semiconductor raised portion by a sputtering process, and then reacting the metal so as to form a salicide. Next, the interlayer insulating film 410 is formed on the entire surface, and the surface is flattened by the CMP method. Then, by photolithography and dry etching, the trench 430 is formed such that a conductive portion (semiconductor raised portion) to be coupled is exposed. Next, as shown in FIGS. 22(d1) and 22(d2), a conductor is filled in the trench 430 via the base film 431 to form the buried conductor interconnect 411. Next, by a known method, the upper interconnect 422 that is coupled to the buried conductor interconnect 411 through a plug or directly can be provided as shown in FIGS. 4(a) to 4(e) or FIGS. 5(a) to 5(d). The grown silicon layer 460 may be provided on the surface of the semiconductor raised portion exposed in the trench after forming the interlayer insulating film 410 and the trench 430, and subsequently, the resistance lowering layer 450 can be formed. A shape similar to that in FIG. 19(b) may be obtained by providing the grown silicon layer 460 on the entire surface of the semiconductor raised portion before formation of the interlayer insulating film 410, and providing the resistance lowering layer 450 on the entire surface of the semiconductor raised portion.

The invention claimed is:

1. A semiconductor device comprising:
    a MIS type field effect transistor which comprises a semiconductor raised portion protruding from a substrate plane, a gate electrode extending over the semiconductor raised portion from the top onto the opposite side faces of the semiconductor raised portion, a gate insulation film existing between the gate electrode and the semiconductor raised portion, and source and drain regions provided in the semiconductor raised portion;
    an interlayer insulating film provided on a substrate including the transistor; and
    a buried conductor interconnect that is formed by filling in a trench formed in the interlayer insulating film with a conductor,
    wherein the buried conductor interconnect connects one of the source and drain regions of the semiconductor raised portion and another conductive portion below the interlayer insulating film.

2. The semiconductor device according to claim 1, wherein the buried conductor interconnect is connected to one of the source and drain regions of the semiconductor raised portion and another conductive portion below the interlayer insulating film, and has an upper face coplanar with the upper face of the interlayer insulating film and a lower face below the upper face of the semiconductor raised portion at an area of connection with the one of source and drain regions.

3. The semiconductor device according to claim 1, wherein the buried conductor interconnect is in contact with opposite side faces of the semiconductor raised portion at an area of connection with the one of source and drain regions.

4. The semiconductor device according to claim 1, wherein the semiconductor device comprises a first transistor and a second transistor as the MIS type field effect transistor, and the buried conductor interconnect is connected to one of source and drain regions of the first transistor and a gate electrode or one of source and drain regions of the second transistor as the another conductive portion.

5. The semiconductor device according to claim 1 wherein the semiconductor device comprises, as the MIS type field effect transistor, a transistor comprising a plurality of semiconductor raised portions protruding from a substrate plane, a gate electrode formed of a conductor provided over the plurality of semiconductor raised portions and extending from the top to the opposite side faces of each semiconductor raised portion, a gate insulating film existing between the gate electrode and each semiconductor raised portion, and source and drain regions provided in each semiconductor raised portion, and
    in the transistor, the buried conductor interconnect is connected to one of source and drain regions of one semiconductor raised portion and one of source and drain regions of another semiconductor raised portion as tic another conductive portion.

6. The semiconductor device according to claim 5, wherein the plurality of semiconductor raised portions are arranged mutually in parallel.

7. The semiconductor device according to claim 1, wherein the buried conductor interconnect is connected through a plug or directly to the upper interconnect.

8. The semiconductor device according to claim 1, wherein the buried conductor interconnect and one of the source and drain regions are connected through a resistance lowering layer made of a metal or a metallic compound.

9. The semiconductor device according to claim 1, wherein the semiconductor raised portion has a part where width W of the part along a direction parallel to the substrate plane and vertical to the channel length direction is larger than width W of a part below the gate electrode at least at an area of connection between one of the source and drain regions of the semiconductor raised portion and the buried conductor interconnect.

10. The semiconductor device according to claim 1, wherein the semiconductor device comprises, as the MIS type field effect transistor, a first conductivity type transistor and a second conductivity type transistor that constitute a CMOS inverter, gate electrodes of the first conductivity type transistor and the second conductivity type transistor are formed of a common conductor, and the conductor is connected to an input node, and the buried conductor interconnect is connected to. a drain region of the first conductivity type transistor and a drain region of the second conductivity type transistor, and is connected to an output node.

11. A semiconductor device comprising a SRAM cell unit having a pair of first and second drive transistors, a pair of first and second load transistors and a pair of first and second transfer transistors, wherein each of the transistors comprises a semiconductor raised portion protruding from a substrate plane, a gate electrode extending over the semiconductor raised portion from the top onto the opposite side faces of the semiconductor raised portion, a gate insulating film existing between the gate electrode and the semiconductor raised portion, and source and drain regions provided in the semiconductor raised portion;

the semiconductor raised portions of the transistors are arranged with their longitudinal direction extending along a first direction;

the first drive transistor and the first transfer transistor have a common first semiconductor raised portion, the second drive transistor and the second transfer transistor have a common second semiconductor raised portion, the first load transistor has a third semiconductor raised portion adjacent to the first semiconductor raised portion, and the second load transistor has a fourth semiconductor raised portion adjacent to the second semiconductor raised portion; and the gate electrodes of the first drive transistor and the first load transistor are formed of a common first conductor, the gate electrodes of the second drive transistor and the second load transistor are formed of a common second conductor, and the conductors are arranged with their longitudinal direction extending along a second direction vertical to the first direction;

an interlayer insulating film is provided on a substrate including the SRAM cell unit;

a first buried conductor interconnect is connected to the first conductor, the drain region of the second load transistor, the drain region of the second drive transistor and one of the source and drain regions of the second transfer transistor, and formed on the interlayer. insulating film; and a second buried conductor interconnect is connected to the second conductor, the drain region of the first load transistor, the drain region of the first drive transistor and one of the source and drain regions of the first transfer transistor, and formed on the interlayer insulating film.

12. The semiconductor device according to claim 11, wherein each of the first and second buried conductor interconnects has an upper face coplanar with the upper face of the interlayer insulating film and a lower face below the upper face of the semiconductor raised portion at areas of connection with the drain regions and the one of source and drain regions.

13. The semiconductor device according to claim 11, wherein the first and second buried conductor interconnects are in contact with opposite side faces of the semiconductor raised portions at areas of connection with the drain region and the one of source and drain regions.

14. The semiconductor device according to claim 11 comprising, as the transistor, a transistor comprising a plurality of semiconductor raised portions protruding from a substrate plane, a gate electrode formed of a conductor provided over the plurality of semiconductor raised portions and extending the top to the opposite side faces of each semiconductor raised portion, a gate insulating film existing between the gate electrode and each semiconductor raised portion, and source and drain regions provided in each semiconductor raised portion.

* * * * *